US006911608B2

(12) United States Patent
Levy

(10) Patent No.: US 6,911,608 B2
(45) Date of Patent: Jun. 28, 2005

(54) KEYPADS AND KEY SWITCHES

(75) Inventor: David H. Levy, Cambridge, MA (US)

(73) Assignee: Digit Wireless, LLC, Cambridge, MA (US)

(*) Notice: Subject to any disclaimer, the term of this patent is extended or adjusted under 35 U.S.C. 154(b) by 0 days.

(21) Appl. No.: 10/445,374

(22) Filed: May 23, 2003

(65) Prior Publication Data

US 2004/0031673 A1 Feb. 19, 2004

Related U.S. Application Data

(60) Provisional application No. 60/382,906, filed on May 23, 2002, provisional application No. 60/419,843, filed on Oct. 21, 2002, provisional application No. 60/431,796, filed on Dec. 9, 2002, and provisional application No. 60/444,227, filed on Feb. 3, 2003.

(51) Int. Cl.[7] ........................ H01H 13/702; H01H 1/00; H03K 17/967; H03M 11/00

(52) U.S. Cl. ........................ 200/5 A; 200/292; 200/406; 200/512; 200/513; 200/516

(58) Field of Search ........................... 200/302.1–302.3, 200/5 R, 5 A, 292, 308–317, 512–517; 345/156–182; 341/20, 22–34; 400/472–490; 700/89; 708/130, 145; 379/88.02

(56) References Cited

U.S. PATENT DOCUMENTS

| | | | | | |
|---|---|---|---|---|---|
| 3,668,337 A | | 6/1972 | Sinclair | | |
| 3,806,673 A | * | 4/1974 | Boulanger | .................. | 200/5 A |
| 3,870,840 A | | 3/1975 | Rivetta et al. | | |
| 3,909,564 A | | 9/1975 | Scheingold et al. | | |
| 3,999,025 A | | 12/1976 | Sims, Jr. | | |
| 4,033,030 A | * | 7/1977 | Robinson et al. | ........... | 200/5 A |
| 4,074,088 A | * | 2/1978 | Keough et al. | ............. | 200/5 A |
| 4,357,646 A | | 11/1982 | McVey et al. | | |
| 4,376,238 A | | 3/1983 | Martin | | |

(Continued)

FOREIGN PATENT DOCUMENTS

| | | |
|---|---|---|
| DE | 3811737 A1 | 10/1989 |
| DE | 19702225 C1 | 5/1998 |
| EP | 0210097 A1 | 1/1987 |
| EP | 0367204 A2 | 5/1990 |
| EP | 0508563 | 10/1992 |
| JP | 01006337 | 1/1989 |
| NL | 1009109 | 11/1999 |
| WO | WO 00/44014 | 7/2000 |
| WO | WO 01/95358 A2 | 12/2001 |
| WO | WO 01/95358 A3 | 12/2001 |

OTHER PUBLICATIONS

W.F. Beausoleil et al., "Compact Keyboard," *IBM Technical Disclosure Bulletin*, vol. 13, No. 11, p. 3574, Apr. 1971.

*Primary Examiner*—James R. Scott
(74) *Attorney, Agent, or Firm*—Fish & Richardson P.C.

(57) ABSTRACT

A keypad with both elevated and non-elevated key regions, and key switches disposed beneath both types of key regions. The non-elevated key regions each provide corresponding character output based on an operation algorithm that considers activation of at least one adjacent elevated key region as well as activation of the switch below the non-elevated key region. The keypad includes a keymat that is rigidly held at its perimeter in a stretched condition across a switch substrate. The key switches include metal snap domes that have an elevated central region forming a downwardly facing cavity defined at its edge by a ridge disposed above the switch contacts that electrically engages multiple switch contacts in an annular contact zone.

42 Claims, 10 Drawing Sheets

U.S. PATENT DOCUMENTS

| | | | | |
|---|---|---|---|---|
| 4,400,593 A | | 8/1983 | Kunz | |
| 4,490,587 A | | 12/1984 | Miller et al. | |
| 4,524,249 A | * | 6/1985 | Farrell | 200/5 A |
| 4,549,279 A | | 10/1985 | Lapeyre | |
| 4,595,809 A | * | 6/1986 | Pool | 200/406 |
| 4,604,509 A | | 8/1986 | Clancy et al. | |
| 4,634,818 A | | 1/1987 | Hayes-Pankhurst et al. | |
| RE32,419 E | | 5/1987 | Rooney | |
| 4,680,577 A | | 7/1987 | Straayer et al. | |
| 4,839,474 A | | 6/1989 | Hayes-Pankhurst et al. | |
| 4,891,777 A | | 1/1990 | Lapeyre | |
| 4,899,137 A | | 2/1990 | Behrens et al. | |
| 4,912,462 A | | 3/1990 | Washizuka et al. | |
| 4,994,992 A | | 2/1991 | Lapeyre | |
| 5,124,689 A | | 6/1992 | Franz et al. | |
| 5,269,004 A | | 12/1993 | Comerford et al. | |
| 5,278,557 A | | 1/1994 | Stokes et al. | |
| 5,311,175 A | | 5/1994 | Waldman | |
| 5,329,079 A | | 7/1994 | English et al. | |
| 5,358,344 A | | 10/1994 | Spence | |
| 5,457,454 A | | 10/1995 | Sugano | |
| 5,459,461 A | | 10/1995 | Crowley et al. | |
| 5,465,290 A | | 11/1995 | Hampton et al. | |
| 5,486,823 A | | 1/1996 | Tsai | |
| 5,491,745 A | | 2/1996 | Roeder | |
| 5,528,235 A | | 6/1996 | Lin et al. | |
| 5,535,421 A | | 7/1996 | Weinreich | |
| 5,612,690 A | | 3/1997 | Levy | |
| 5,635,958 A | | 6/1997 | Murai et al. | |
| 5,638,092 A | | 6/1997 | Eng et al. | |
| 5,691,716 A | | 11/1997 | Crowley et al. | |
| 5,793,312 A | | 8/1998 | Tsubai | |
| 5,852,414 A | | 12/1998 | Yu et al. | |
| 5,861,588 A | | 1/1999 | Gillot | |
| 5,861,823 A | | 1/1999 | Strauch et al. | |
| 5,973,621 A | | 10/1999 | Levy | |
| 6,037,882 A | | 3/2000 | Levy | |
| 6,107,997 A | | 8/2000 | Ure | |
| 6,204,839 B1 | | 3/2001 | Mato, Jr. | |
| 6,377,685 B1 | | 4/2002 | Krishnan | |

* cited by examiner

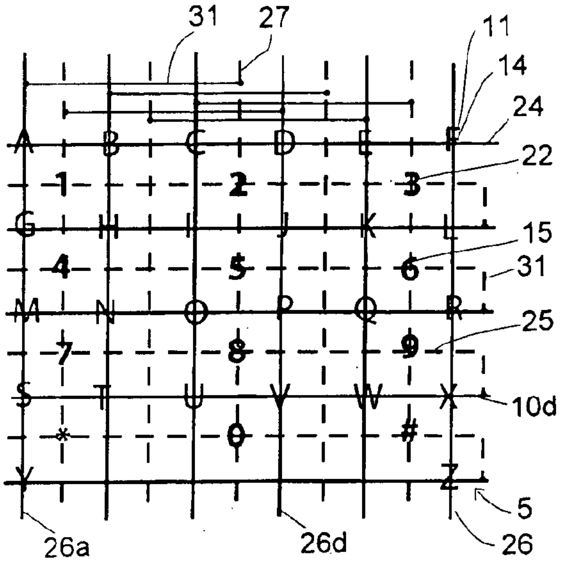
FIG. 6
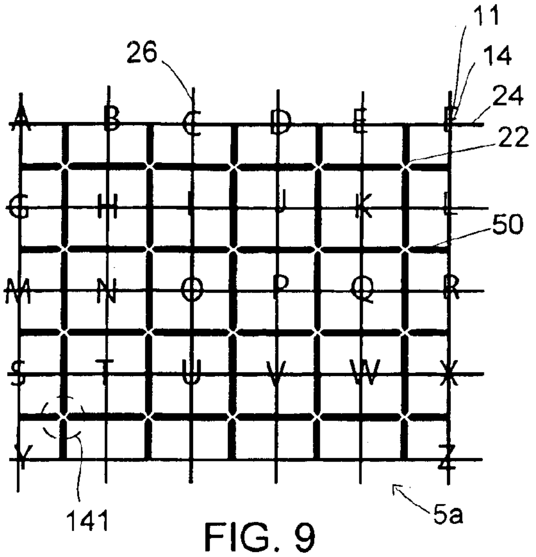
FIG. 9
FIG. 7
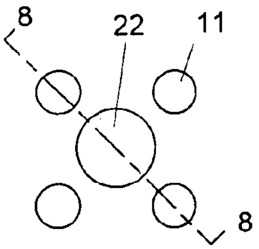
FIG. 10
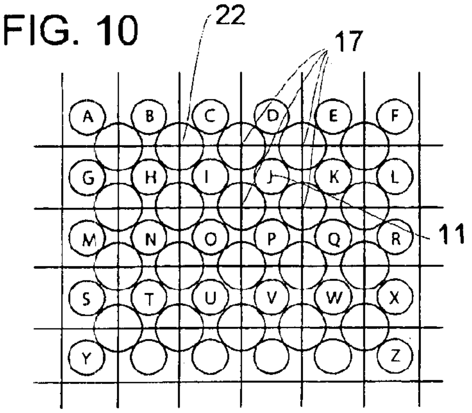
FIG. 8
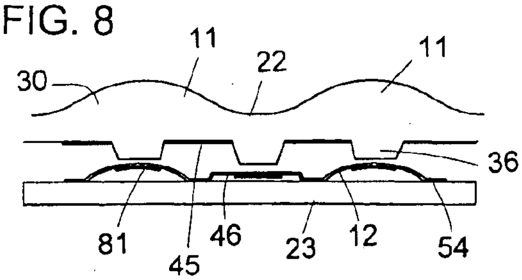

FIG. 17
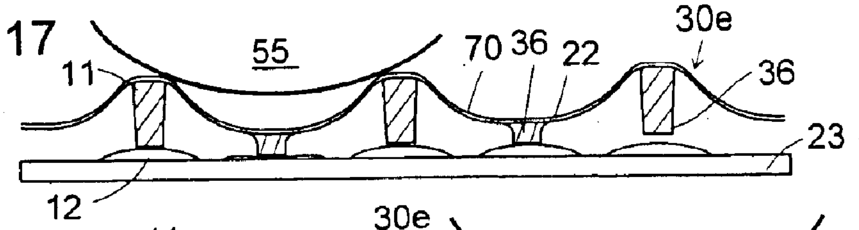
FIG. 18
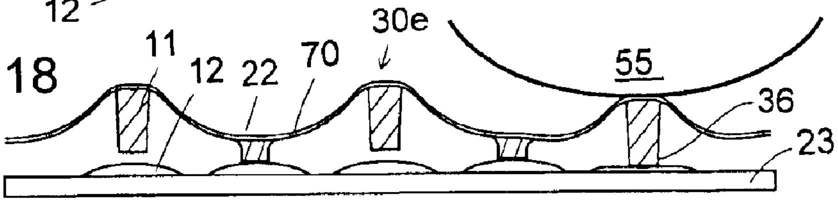
FIG. 19
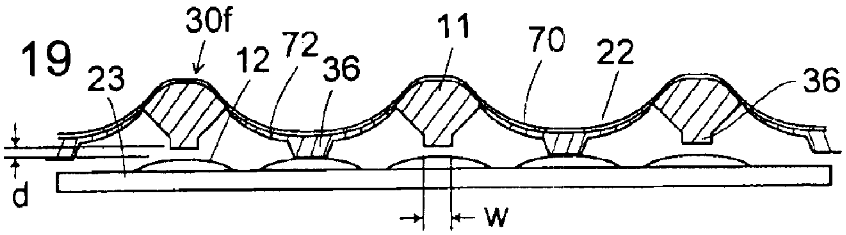
FIG. 20
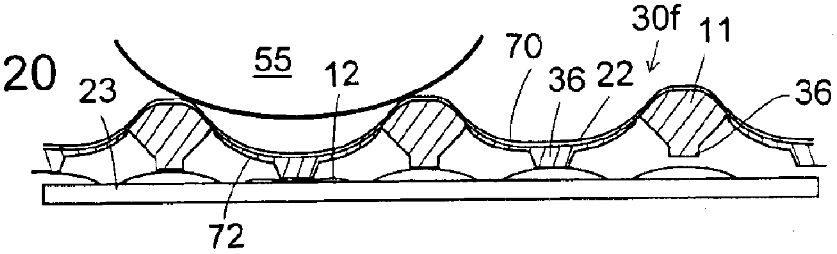
FIG. 21
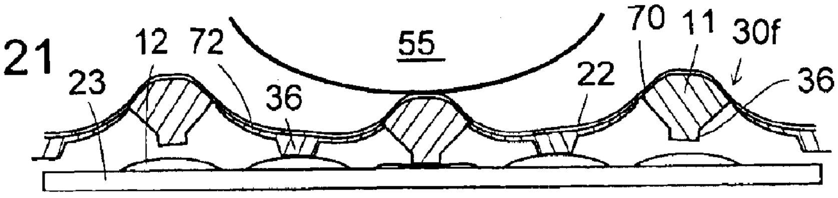
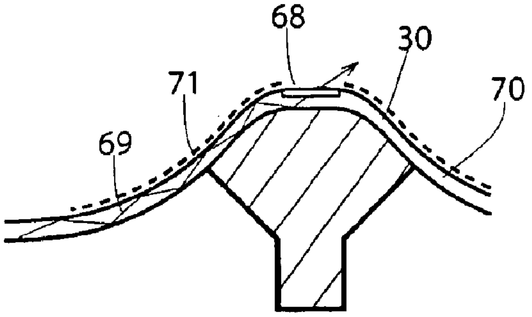
FIG. 22
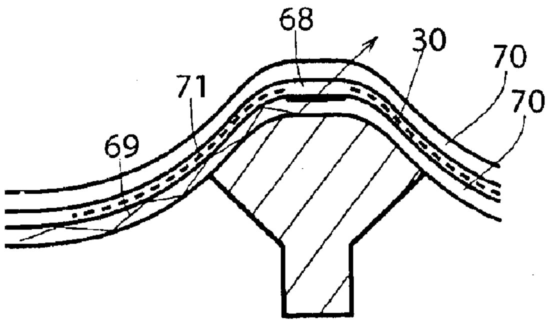
FIG. 23

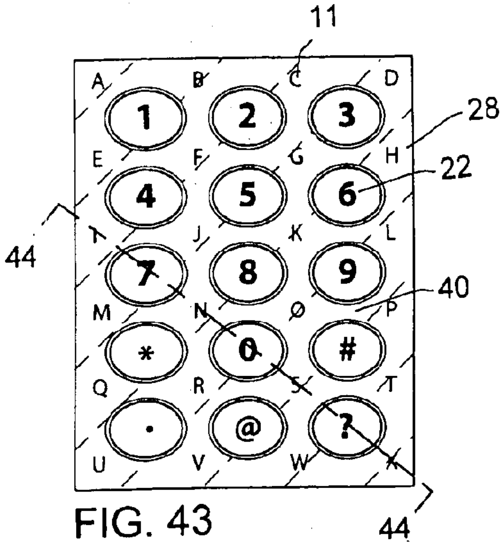
FIG. 43
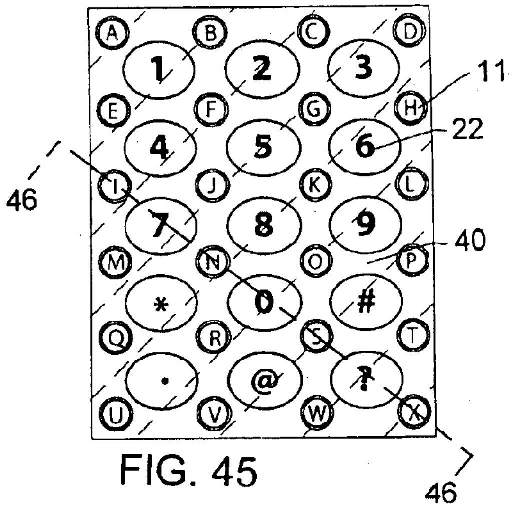
FIG. 45
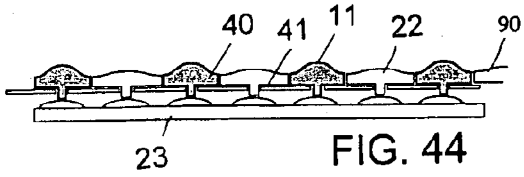
FIG. 44
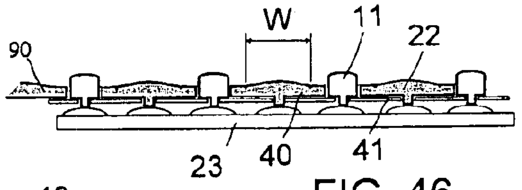
FIG. 46
FIG. 47
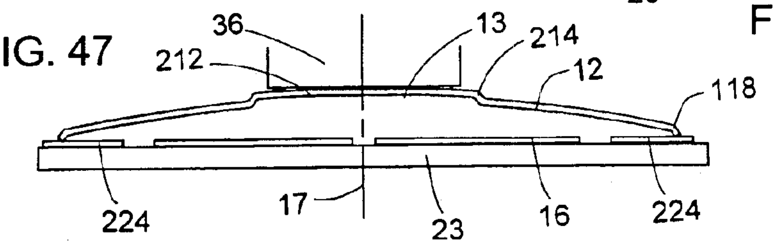
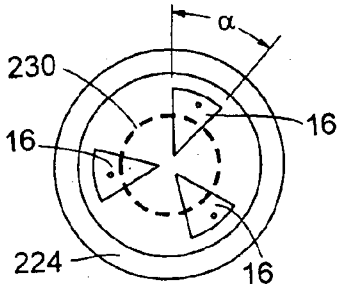
FIG. 48
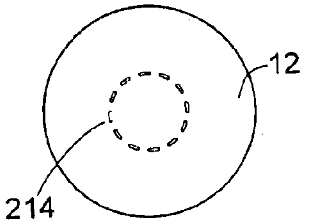
FIG. 49

KEYPADS AND KEY SWITCHES

CROSS-REFERENCE TO RELATED APPLICATIONS

This application claims priority under 35 U.S.C. §119(e) from the following four U.S. provisional applications: U.S. Ser. No. 60/382,906, filed May 23, 2002; U.S. Ser. No. 60/419,843, filed Oct. 21, 2002; U.S. Ser. No. 60/431,796, filed Dec. 9, 2002; and U.S. Ser. No. 60/444,227, filed Feb. 3, 2003. The entire technical disclosures of these four provisionals are incorporated herein by reference.

TECHNICAL FIELD

This invention relates to keypads, and to key switches for keypads and keyboards.

BACKGROUND

The miniaturization of electronic products is one of the primary tenets of technologic advance. Competitive advantage and the success of a product line largely hinges on the ability of a company to successfully provide products that are both increasingly functional and increasingly portable. As technology advances, it becomes increasingly possible to miniaturize electronic circuitry below human scale, with the result being that the interface alone (e.g., screens, keypads, cursor control devices) come to define the size of portable products. Therefore, the ergonomic quality and size of input devices (such as keypads) continue to have a growing significance to product acceptance and success.

One type of keypad or keyboard that provides a particularly space-efficient input means are Independent And Combination Key (IACK) keypads, having arrays of effectively lower, concave combination key regions interspersed among an array of effectively elevated, convex independent key regions. IACK keypads have both independent and combination key regions, typically arranged in alternating rows and columns. Independent key regions of my prior IACK keypads were elements of the keypad that, when pressed independent of adjacent keys, produced an associated output. By contrast, the combination key regions of my prior IACK keypads were keypad elements with adjacent independent keys (such as at diagonally-oriented corners of the combination key region) with no corresponding key switches underlying the keymat. Output corresponding to the combination key region was produced by pressing two or more adjacent elevated key regions in combination.

Other improvements leading to reliable operation of increasingly miniaturized keypads are desired, even in keypads that don't require the output of some key regions to be produced by activating combinations of switches corresponding to other key regions. For example, improvements are sought in the construction of key switches that can reliably and near-simultaneously close multiple electrical connections with a single, defined tactile feedback event. There is a class of keyboards and keypads, including IACK keypads, that require multiple key switch contacts to be made simultaneously. Snap domes (made from materials such as metal and plastic) that operate in a buckling mode provide a high quality of tactile feedback. It is extremely difficult, however, to make reliable momentary connection to more than one key switch contact at a time.

SUMMARY

According to one aspect of the invention, an improvement is provided for keypads having a matrix of key regions including both an array of elevated key regions each providing a corresponding character output when actuated, and key regions interspersed between the elevated key regions and providing character output based at least in part on an operation algorithm that includes activation of at least one adjacent elevated key region. The improvement features corresponding, independently actuatable key switches disposed below the interspersed key regions, the operation algorithm also including actuation of the associated switches below the interspersed key regions.

Preferably, adjacent elevated key regions have an on-center distance of less than about half the width of the adult human finger.

In some cases, corresponding tactile feedback elements underlie each elevated key region and each interspersed key region.

In some implementations the operation algorithm, in response to sensing a combined switch actuation including any switch underlying an elevated key region and a switch underlying an interspersed key region, produces an output corresponding to the interspersed key region.

In some instances the operation algorithm, in response to sensing a combined switch actuation including a switch underlying an interspersed key region and any switch underlying an elevated key region immediately adjacent that interspersed key region, produces an output corresponding to the interspersed key region.

In some situations, each switch disposed below an interspersed key region is directly connected to a switch disposed below another interspersed key region on one side, and to a switch disposed below an elevated key region on another side.

The interspersed key regions, in at least some embodiments, have exposed surfaces that are convex. In some other cases, they are substantially flat.

In some cases, the elevated key regions each include an elevated ridge defining a top surface and each interspersed key region is immediately adjacent a plurality of the elevated key regions.

In some embodiments, the keypad includes a printed circuit board with traces electrically connecting each of at least some switches underlying elevated key regions with a switch underlying a corresponding one of the interspersed key regions.

In some cases, the keypad has a printed circuit board with four electrical trace extensions extending to beneath each of the interspersed key regions, to form switch contacts. For example, two of the trace extensions under each interspersed key region may connect to a tactile dome, and the other two trace extensions connect to exposed traces that are momentarily placed into electrical contact when that interspersed key region is actuated.

In some preferred constructions, each switch disposed below an interspersed key region is actuated by electrical traces of a printed circuit board contacting a discontinuity in an inner surface of a metal snap dome. Preferably, the traces contacted by the snap dome surface discontinuity form three discrete contacts spaced about a circular contact zone beneath the snap dome. The traces may be pie-shaped beneath the snap dome, for example.

In some cases, the switches disposed below the interspersed key regions each includes a tactile feedback element and a carbon ring. In such cases, the tactile feedback elements may be electrically passive. The switches disposed below the interspersed key regions may each be connected to three signal traces, forming a single access to the switch from one side of the matrix, and two access points from another side of the matrix.

In some keypads, either the elevated or interspersed key regions are respective areas of a molded plastic keymat that flexes during key actuation. In some cases, key regions that are not respective areas of the molded plastic keymat are exposed through respective, spaced apart holes in the keymat. In some cases, snap dome actuators are molded to extend from a lower surface of the keymat. The keymat may also be molded integrally with a product housing.

In some other cases, the key regions are upper surfaces of keys secured to a sheet held in a stretched condition above an array of key switches. The stretched sheet may comprise a sheet of elastomeric resin, for example. Preferably, the elastomeric sheet is held in a stretched condition of at least 20 percent in at least one direction. In some instances, the stretched sheet comprises a plastic sheet molded to have a resiliently distendable region, such as a pleat extending out of a principal plane of the sheet.

According to another aspect of the invention, an improvement is provided for a keypad comprising a keymat and a switch substrate underlying the keymat, the keymat having an exposed upper surface forming separate elevated key regions that, when pressed independent of adjacent key regions, produces an associated output, the keymat also defining other key regions interspersed between adjacent elevated key regions and labeled to indicate other associated outputs. The improvement features that the keymat is rigidly held at its perimeter in a stretched condition across the switch substrate.

In some embodiments, the elevated key regions are upper surfaces of rigid keys secured to an elastomeric sheet.

The elastomeric sheet is preferably held in a stretched condition of at least 20 percent in a given direction, or held stretched in each of two orthogonal directions.

Some examples feature a keymat with a plastic sheet molded to have a resiliently distendable region, such as a pleat extending out of a principal plane of the sheet.

In some embodiments, the keymat defines peripheral holes that, with the keymat stretched, receive pins of a rigid keypad housing.

According to a third inventive aspect, an electrical key switch includes a printed circuit board with at least two switch contacts that are normally electrically isolated from each other, and a metal snap dome disposed above the printed circuit board. The dome has an elevated central region forming a downwardly facing cavity defined at its edge by a ridge disposed above the switch contacts, such that when the snap dome is actuated the ridge about the central region engages the printed circuit board in an annular contact zone across the switch contacts, making electrical contact between the snap dome and the switch contacts.

In some embodiments, the snap dome has an outer edge disposed against and in electrical contact with a reference trace on the printed circuit board.

Preferably, the annular contact zone is about one-third of a nominal diameter of the metal dome.

The switch contacts, in one illustrated embodiment, are wedge-shaped. Preferably each switch contact extends across about 20 degrees of the circumference of the contact zone.

The switch contacts are preferably disposed approximately equidistant from each other about the contact zone.

In some cases the ridge forms a continuous ring. In some other cases the ridge comprises a ring of spaced ridges or ridge segments.

In some applications the snap dome overlays three spaced apart switch contacts.

In some cases, the switch contacts are sufficiently thick that the deflected snap dome contacts all underlying switch contacts before contacting any other surface of the PCB, and preferably the snap dome is sufficiently thin and the switch contacts sufficiently spaced apart that, with the deflected dome in contact with all of the underlying switch contacts, the dome can deflect further toward the PCB between adjacent switch contacts.

In another inventive improvement to a keypad comprising a keymat and a switch substrate underlying the keymat, the keymat having an exposed upper surface forming separate elevated key regions that, when pressed independent of adjacent key regions, produces an associated output, the keymat also defining other key regions interspersed between adjacent elevated key regions, the switch substrate includes both switches underlying associated and elevated key regions and switches directly underlying corresponding ones of the interspersed regions.

According to another aspect of the invention, a keypad includes a keymat and a light source. The keymat has a continuous sheet with an exposed, undulating upper surface forming separate elevated independent key regions that, when pressed independent of adjacent keys, produces an associated output. The sheet defines combination key regions between adjacent independent key regions that, when pressed in combination, produce an output associated with the combination key region. The light source introduces light into an optically transmissive layer of the keymat, thereby illuminating graphics associated with multiple key regions of the keymat with light conducted along the keymat layer from the light source. In some cases, significant portions of the light used to illuminate graphics is introduced from the side, thereby producing what could be called side-lighting, as opposed to “back” lighting.

According to another aspect of the invention, a keypad has a matrix of key regions including both an array of elevated key regions each providing a corresponding character output when actuated, and key regions interspersed between the elevated key regions and providing character output based at least in part on an operation algorithm that includes activation of at least one adjacent elevated key region. The interspersed key regions notably have a convex upper surface.

According to another aspect of the invention, a method for providing reliable electrical connection between at least three electrical contacts and providing a single tactile feedback including disposing said electrical contacts around a central tactile feedback element and disposing at least one conductive elastomeric element above the electrical contacts such that conductive elastomeric element provides continuity between the electrical contacts as the tactile feedback is provided.

In some cases, the method includes utilizing the base of a metal dome as one electrical contacts. In some cases, the center of a metal dome is used as an electrical contacts.

Advantageously, two independent circuits may be established simultaneously or near-simultaneously.

In some cases, each of the independent circuits is associated with a hill key of an IACK keypad. In some applications, the continuity establishes a user’s intent to activate the valley key of an IACK keypad.

According to another inventive aspect, a keypad includes a keymat having a continuous sheet with an exposed, undulating upper surface forming separate elevated independent key regions that, when pressed independent of adjacent keys, produces an associated output, the sheet defining combination key regions between adjacent independent key regions that, when pressed in combination, produce an output associated with the combination key region. The keypad also has a light source introducing light into an optically transmissive layer of the keymat, thereby illuminating graphics associated with multiple key regions of the keymat with light conducted along the keymat layer from the light source.

In some embodiments, the optically transmissive layer is of an optically transmissive polymer in continuous contact with the sheet having the exposed upper surface.

Some such keypads also include a light pipe disposed between the keymat and the light source and configured to direct light from the light source toward a light inlet on the keymat.

The optically transmissive layer may comprise an elastomeric web, for example, containing a series of rigid inserts disposed directly above corresponding tactile feedback elements associated with independent key regions of the keymat.

According to another aspect of the invention, a keypad includes a keymat defining an array of discrete key regions, an array of snap domes, each snap dome underlying a corresponding key region of the keymat, and a pattern of electrical traces underlying the snap domes. Each snap dome is arranged to electrically connect at least three electrical traces when actuated by pressing on its corresponding key region.

In some embodiments, the electrical traces connected during actuation of a snap dome each extend to a distal end underlying the snap dome.

In some cases, each snap dome is arranged to electrically connect four electrical traces when actuated by pressing on its corresponding key region.

Some aspects of the invention can enable a miniaturized keypad that still has a well-defined, subjectively good tactile feedback for each key entry, whether of an elevated or non-elevated key region. Other features disclosed and claimed herein can improve the durability of keymats, such as by providing a hard plastic keypad that allows the keypad to be integrated with the housing, minimizing the number of exposed edges in a keypad tiling, etc. Still other improvements increase the useful life and operability of flexible keymats. The improved dome switch construction disclosed herein can produce reliable, near-simultaneous connections across two or more contact paths with a single tactile feedback to the user.

Placing multiple switches under a finger is at odds with basic tenets of sound ergonomic design: that of providing one distinct tactile feedback for each input received. Some of my early attempts to provide a high-level (metal dome) tactile feedback yielded unacceptable combination key reliability and multiple "clicks" per input. Ultimately, the solution presented by some of the embodiments disclosed herein required multiple concurrent changes, including adding an additional tactile feedback (as a means to solve the problem that there was already too much feedback), adding a submatrix within the PCB matrix (which, without some of the improvements disclosed herein) would have the undesirable effect of increasing the number of lines to a central processor, and, in some respects, abandoning the early IACK concept (of having opposing diagonals of elevated keys producing an output associated with a central combination key region) in favor of a hierarchical approach between non-elevated and elevated keys, in which the non-elevated keys became dominant. Furthermore, the improved keymat structures improves the ability of a generic finger to actuate both independent and combination keys reliably.

A keypad structure is provided that employs the relative height and relative strength of a single dome structure with respect to four surrounding it, and a relatively weak deflection force within the keymat itself. This approach is particularly advantageous in combination with convex, non-elevated keys.

The reliability of making multiple switch contacts with a single metal dome is enhanced by narrowing the traces that contact the discontinuity and thickening the metal of the traces such that portions of the discontinuity locate between the three discrete contacts may materially deflect toward a printed circuit board as the discontinuity is in contact with the three discrete contacts. The reliability of making multiple contacts at once is particularly enhanced, especially if the snap dome and traces only contact each other at the "triple point", or locations that divide the diameter approximately into thirds.

Material property differences between an elastomeric keypad web held in a plastic housing can result in a loss of contact with the snap domes under extreme temperature variations. In order to maintain contact between the keymat actuators and domes without needing to use an adhesive (which adds service and manufacturing concerns) it is desirable to assemble the keymat into a pre-stressed or stretched state.

The details of one or more embodiments of the invention are set forth in the accompanying drawings and the description below. Some of these embodiments are described with respect to improvements to IACK keypads, or to keypads having key regions whose output is determined only by the combined states of switches associated with adjacent, elevated key regions. However, it will be understood that several aspects of the invention are not limited to such types of keypads, and that others distinguish such operational algorithms. Other features, objects, and advantages of the invention will be apparent from the description and drawings, and from the claims.

DESCRIPTION OF DRAWINGS

FIG. 6 shows a representation of a first switch matrix for an IACK keypad.

FIG. 7 is a top view of a portion of a keypad, with a recessed key region surrounded by four elevated key regions.

FIG. 8 is a cross-sectional view, taken along line 8—8 in FIG. 7.

FIG. 9 shows a representation of a second switch matrix for an IACK keypad.

FIG. 10 shows an inverted form of IACK keypad.

FIGS. 17 and 18 illustrate the actuation of a combination key region and an independent key region, respectively, of the keypad of FIG. 16.

FIG. 19 shows a keymat with tapered ribs on its underside.

FIGS. 20 and 21 illustrate the actuation of a combination key region and an independent key region, respectively, of the keypad of FIG. 19.

FIG. 22 shows a one-layer keymat with side lighting.

FIG. 23 shows a two-layer keymat with side lighting.

FIG. 43 shows a keymat with independent key regions defined on a rigid structure.

FIG. 44 is a cross-sectional view, taken along line 44—44 of FIG. 43.

FIG. 45 shows a keymat with combination key regions defined on a rigid structure.

FIG. 46 is a cross-sectional view, taken along line 46—46 of FIG. 45.

FIG. 47 is a cross-sectional view taken through a metal dome designed to contact multiple switch elements at once.

FIG. 48 shows the PCB traces underlying the dome of FIG. 47.

FIG. 49 shows a discontinuous ring element on the underside of a metal dome.

Like reference symbols in the various drawings indicate like elements.

DETAILED DESCRIPTION

Figure 1:
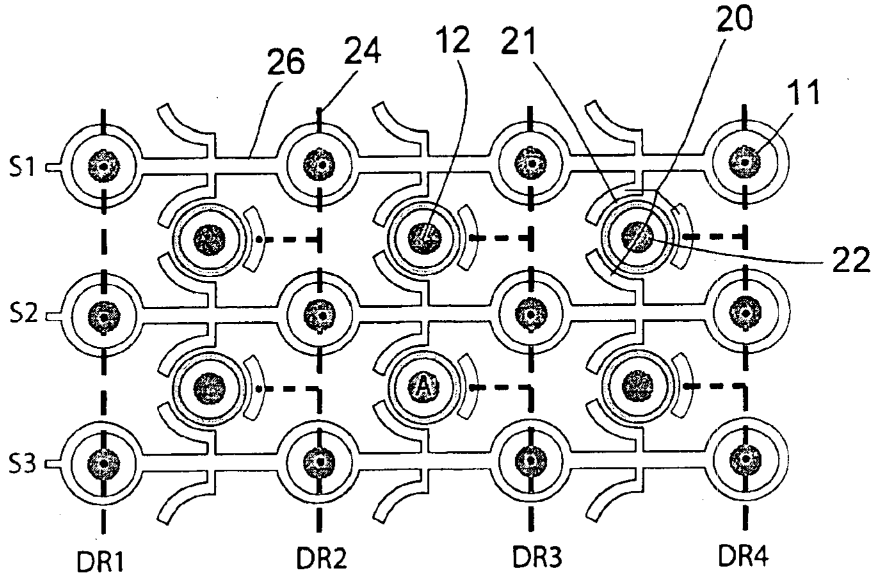
FIG. 1 shows a first printed circuit board (PCB) for a keypad, with some switches including both exposed carbon and metal dome switch plates.
Figure 2:
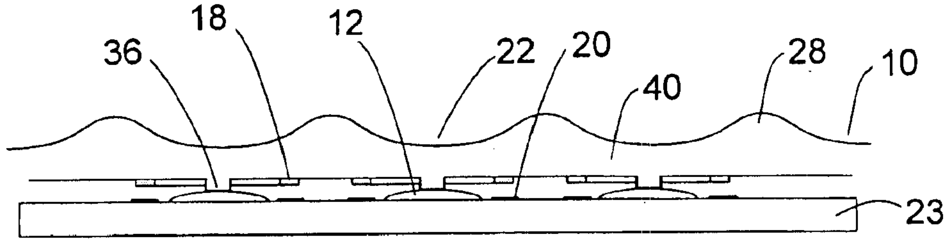
FIG. 2 shows a cross section of a keypad with elevated and interspersed key regions.

FIG. 1 shows traditional snap domes 12 (made of metal or plastic) providing a momentary connection between two lines located at one of the intersections of drive lines 24 (shown vertical) and sense lines 26 (shown horizontal), tinder the independent keys 11 of an IACK keypad having an array of elevated independent key regions 11 and, interspersed between the elevated keys, combination key regions 22 (see also FIG. 2). Centrally oriented switch contacts 21 have three auxiliary contact pads 20, each connected to one of the three lines (in this case two drive lines 24 and one sense line 26) associated with two snap domes 12 which are adjacent to each other in one row (i.e., not kitty corner or diagonally adjacent to each other about switch contact 21, but both located on one side of it, in this case the right side.) Therefore, to operate a switch contact 21, the user presses the combination key 22 causing auxiliary conductors 18 (see FIGS. 2 and 3) to contact the auxiliary contact pads 20, thereby activating the two snap domes 12 located under the independent keys 11 located to the right of each combination key 22. That is to say, a drive signal (an electrical word) introduced across the keypad of 0,0,1,0 (an 'ON' signal only on DR3) and sensing an electrical word of 0,1,1 (S2 and S3 are 'ON') indicates user activity on the lower combination key 22 to the left of the drive line 24 labeled DR3 (here the letter 'A'). Therefore, even though four keys are associated with each combination key 22, the only two keys necessary to determine which combination key 22 is actuated and furthermore, these two share a common drive (or sense) line. An additional benefit provided by this structure is that either an independent key 11 or a combination key 22 can be sensed during a single clock cycle, as demonstrated above. This is an advance over prior IACK keypads that required at least two clock cycles to identify both 'independent and combination' keys. Some prior art IACK keypads activated two drive lines 24 at once, potentially allowing combination keys to be determined in a single cycle, but then required an additional cycle to identify a single key reliably, specifically to eliminate the possibility of simultaneous actuation of two horizontally adjacent keys. Other prior art IACK keypads drove one line at a time, requiring additional cycles to identify combinations. Allowing the processor to identify both types of keys in a single cycle lowers the burden of the processor, allowing it to spend more time doing other operations.

Also note that the snap dome 12 located between the auxiliary contact pads 20 (under the combination key 22) provides tactile feedback and provides no electrical function in this embodiment. This embodiment can have the limitation of providing erroneous combination key output when one axis (vertical as shown here) of adjacent independent keys are pressed erroneously in combination.

FIG. 2 shows a cross-section through an IACK keypad 10. Snap domes 12 (made of metal or plastic) are disposed below actuator 36, centered preferably below the interspersed combination keys 22. Auxiliary conductors 18 are made of a compliant and conductive material such as a carbon-doped urethane. Auxiliary contacts 20 are disposed on printed circuit board 22 below auxiliary conductors 18. The relationship between the bottom surface of auxiliary conductors 18, auxiliary contacts 20 and snap domes 12 is critical as these elements, in combination, simulate the "feel" of the typical action of snap dome 12. That is to say that as typical snap dome 12 actuates, it provides electrical continuity simultaneous to providing tactile feedback in the form of buckling of the snap dome 12. In this embodiment, the user receives the same perception as the snap dome 12 buckles and electrical continuity is made with auxiliary contacts 20, yet switch 21 provides no electrical function. In other embodiments (such as in FIG. 5) switch contact 21 also provides electrical functionality.

Figure 3:
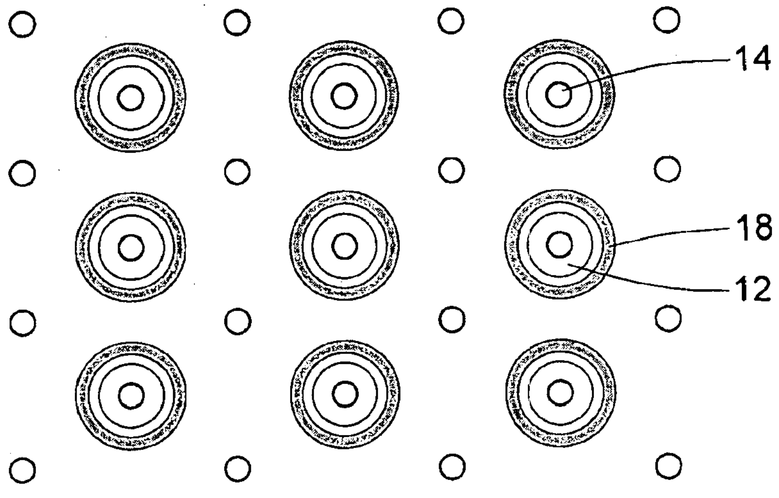
FIG. 3 is a bottom view of the keymat of the keypad of FIG. 2.

FIG. 3 shows a plan view of the region between the web 40 of IACK keypad 10 and printed circuit board (PCB) 23, as shown in FIG. 2. Actuator 36 is over snap domes 12, which are both surrounded by auxiliary conductor 18. While auxiliary conductor 18 is shown in a ring shape, other shapes, including discontinuous shapes, can bridge the auxiliary contacts 20.

Figure 4:
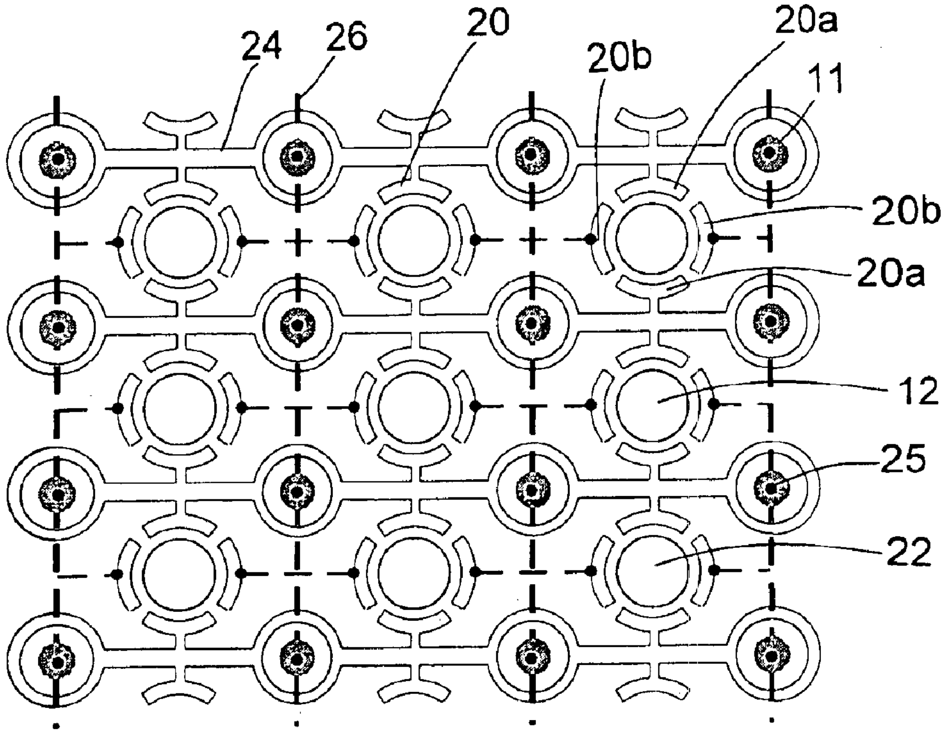
FIG. 4 shows a second PCB, with traces extending from four sense lines and terminating at exposed carbon switch plates.

FIG. 4 shows centrally oriented switch contacts 21 with four auxiliary contact pads 20. Drive lines 24 run in a first primary axis (horizontally) and sense lines 26 run perpendicular to them (vertically). Sense lines 26 are drawn dashed to indicate they lie in a lower layer of the PCB. At each intersection between drive lines 24 and sense lines 26 lay standard snap domes 12 to provide momentary contact between them when elevated key regions 11 are pressed. Auxiliary contacts 20*a* are electrically connected with drive lines 24 and auxiliary contacts 20*b* are electrically connected with sense lines 26. Note that auxiliary contacts 20*b* and centrally-oriented switch contact 21 are connected to the submerged sense lines 26 through vias 25. When the combination key 22 is pressed, snap domes 12 provides a tactile feedback while auxiliary conductors 18 (FIG. 3) provide electrical continuity between all the associated auxiliary contacts 20*a* and 20*b*. The result is that contact between the auxiliary conductors and the PCB provide the electrical equivalent of actuating all four adjacent independent keys 11.

Figure 5:
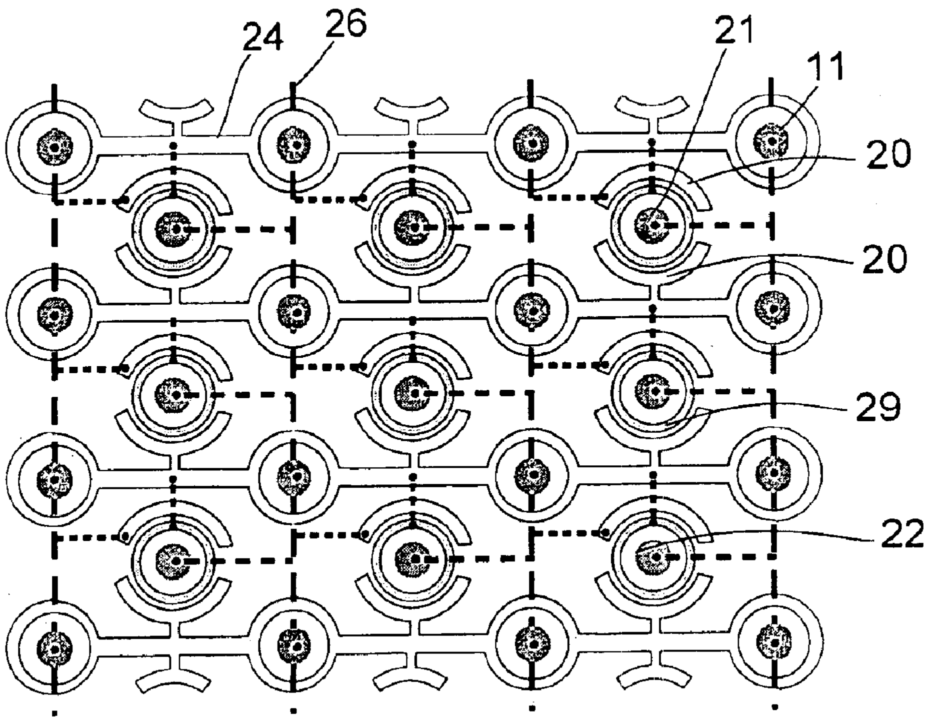
FIG. 5 shows a third PCB trace layout.

Referring next to FIG. 5, the base of snap dome 12 (preferably made of metal) rests on a printed conductive base 29 in electrical contact with the drive lines 24 above it, and the center of switch 21 is in electrical continuity with the sense line 26 to its right. The result is that actuation of associated snap dome 12 is the electrical equivalent of actuating the switch under the independent key 11 located upwards and to the right of the intended combination key 22. Also shown is one auxiliary contact 20 in electrical continuity with the drive line 24 below it, and one auxiliary contact 20 in electrical continuity with the sense line 26 to its left. A tape layer covers the snap domes 12, preventing contact to auxiliary conductor 18 (FIG. 3), and also has cut outs corresponding with auxiliary contacts 20 that allow contact between the auxiliary conductors and the PCB. The result is that actuation of associated snap dome 12 is the electrical equivalent of actuating the switch under the independent key 11 located downwards and to the left of the intended combination key 22. The simultaneous actuation of these two independent keys 11 (located diagonally opposite from each other across a combination key 22) acts as an indication to the controller that the intent is to actuate the central combination key.

FIG. 6 shows a representation of a switch matrix 5 for an IACK keypad. Although drive lines 24 are electrically isolated from sense lines 26, electrical connectivity between them can be made at each independent intersection 14, which, in this embodiment, corresponds to the location of an independent key 11 (see FIG. 8). Matrix 5 also includes horizontal combination traces 25 and vertical combination traces 27, both shown in dashed lines. Combination intersection 15 between corresponding traces 25 and 27 is activated when the user presses on combination key 22 (FIG. 8). Matrix 5 is driven through drive lines 24 and read by the processor inputs along sense lines 26. Each horizontal combination trace 25 is electrically connected to the drive line 24 directly below it through a bridge 31. Each vertical combination trace 27 is electrically connected by a bridge 31 to a sense line 26 that is separated from the vertical combination trace 27 by at least one other sense line 26. In the arrangement shown, each vertical combination trace 27 is electrically connected to a sense line 26 that is separated from the vertical combination trace by two other sense lines 26. Vertical combination traces 27 are electrically isolated from horizontal combination traces 25, although electrical connectivity can be made at each combination intersection 15, which in this embodiment corresponds to a respective combination key 22 (FIG. 8).

This structure creates a redundancy between combination intersections 15 and independent intersections 14 in such a way that a single finger cannot physically strike both at once. For example, this system cannot distinguish between electrical connectivity at the independent intersection 14 under the letter "G" and electrical connectivity at the combination intersection 15 under the number "2". The two switches are, in a sense, redundant. Similarly, each independent intersection 14 has an associated combination intersection 15, which we can call a phantom switch, and the two keys corresponding to each pair of associated switches are impossible to simultaneously press with one finger. That is to say, each phantom (combination) switch has a real and measurable output, but only when measured at its associated independent intersection 14. However, without additional information it is impossible for the system to know, from sensing the matrix, which of the two associated switches is closed. This structure allows for a new algorithm for analyzing user intent to actuate combination key regions, as described below. The new algorithm is based on the pairing of actual independent key switches 14 with distant "phantom" combination key switches 15, using known physical relationships between keys and determining the sensed sequence of contact closings to effectively create an entire additional, overlapped switch matrix, thereby providing a finer switch resolution without increasing the number of processor connections.

Still referring to FIG. 6, if the system indicates the user is simultaneously pressing the letter "S" (i.e., contact between sense line 26*a* and drive line 24*d* is registered) and any (or all) of the set "U", "O" and "P", the user must be pressing the number "8". On the other hand, if the system senses the user is simultaneously pressing the letters "S" and "V" (i.e., contact between lines 24*d* and both 26*a* and 26*d* is registered), the user could be pressing either the "7" or the "8", as the keys "V" and "7" are one redundant pair, and "S" and "8" are another pair. In such a case, the next level of differentiation may be determined by identifying the order of key actuation, knowing that the independent keys of the matrix are raised or are otherwise structured so as to close their underlying switches before those of adjacent combination keys. If the "V" was registered first, therefore, the intended input is "8". If the "S" was registered before the "V", the user intended a "7". In this example, the order of actuation is determined by the relative heights of the actuators 36 of FIG. 8. While many variations are possible, in each case only one independent key switch and its associated phantom switch (which is registered as a second independent key) must be activated to allow the system to determine user intent to actuate a combination key 22. A significant benefit of this approach is that, although it contains a greater number of traces than a standard IACK keypad, it does not require an increased number of connections to a processor, as the combination traces 25 and 27 are sensed only via the independent traces 24 and 26.

The matrix arrangement in FIG. 6 enables a method for identifying user intent in an IACK keypad, in which the order of key actuation is a determining factor in identifying the desired key input. This provides an example of a keyboard switch matrix in which electrically equivalent rows of the matrix are spaced from each other by at least four rows that are electrically non-equivalent.

Referring to FIGS. 7 and 8, independent key or key regions 11 are elevated relative to combination key region 22. Actuators 36 transmit the force from an activating finger to actuate the underlying switch elements, and the relative heights of the actuators 36 and the relative heights of the keys play a role in determining the order of key actuation. Polyester dome array 54 includes snap dome 12 directly beneath independent key regions 11, and a low-force switch element 46 (such as flat membranes) disposed directly beneath combination key region 22. Polyester dome array 54 also includes conductive ink 81 printed on the underside of the tactile and switch elements that closes switches printed on PCB 23 when the keys are pressed. Low-force switch elements 46 are preferred because of the low displacement force required to activate them increases the reliability of combination key activation.

In pressing a combination key region 22, the user may activate anywhere between one and four of the snap domes 12 (FIG. 8) associated with the surrounding independent key regions 11. The result will be one to four tactile feedback "clicks" as the selected combination key 22 is pressed.

FIG. 9 shows drive lines 24 electrically isolated from sense lines 26, although electrical connectivity between them can be made at each independent intersection 14, corresponding to the location of an independent key region 11. As in some earlier IACK keypads, the software of the system registers a combination key input as a result of activation of at least two diagonally adjacent (i.e. opposite adjacent) independent key regions 11. For example, activating both "E" and "L", or "F" and "K", is registered by the system as an intention to enter the number "3". In this matrix, however, trace extensions 50 extend from each of the four trace segments that bound each combination key region 22, to almost contact each other at each combination intersection 15. Trace extensions 50 extend in each combination key region 22 to within a contact region 141. Extensions 50 may be made of as conductive ink 81 (FIG. 8) which may be selectively doped or otherwise varied to provide a unique resistance at each intersection during contact, such that the identity of the intersection under contact can be verified by sensing trace resistances.

Actuation of a combination key 22 directly above a combination intersection 15 closes contact between the four adjacent ends of the trace extensions 50 at that intersection 15, thereby connecting the adjacent pairs of drive lines 24 and sense lines 26 and creating the electrical equivalent of actuating all four surrounding independent intersections 14. Examples of switch constructions for connecting all four trace extensions 50 of a given combination intersection 15 are shown in FIGS. 4, 5 and 47–49.

In FIG. 10 each independent key region 11 is associated with four alternate intersections 17, and therefore four switch elements 21. As with some prior art IACK keypads, two adjacent diagonal switches (of the associated set of four) are required to indicate the user's intent to input each central character (i.e., a character registered by activation of more than one surrounding keys) to the system. In this embodiment, however, that central character is located on an elevation. Likewise, combination keys 22 sit over a single alternate intersection 17. As shown, this arrangement requires two additional lines to the processor, but allows combination keys 22 to be readily identified by a single switch element. Likewise, because independent keys 11 include an elevated center, the force applied by the finger is much more evenly distributed, greatly enhancing the probability of activating adjacent diagonals, thereby improving the overall performance, especially of discrete switch implementations in an IACK keypad.

Figure 11:
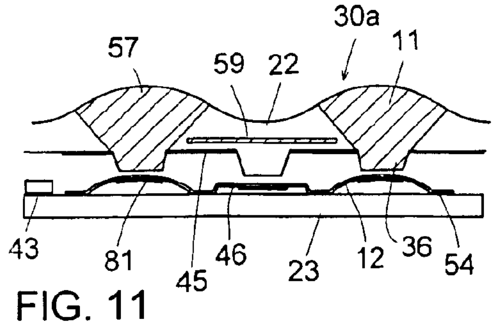
FIGS. 11–13 are cross-sectional views illustrating alternate keymat constructions.

FIG. 11 shows a keymat 30*a* molded to include high durometer wedges 57 at raised independent key regions 11, surrounded by a lower durometer material exposed at the combination key regions 22. In this embodiment, wedges 57 are cone-shaped, with outermost portions of the wedges extending above rigid plates 59 under the combination key regions. As independent keys 11 are pressed beyond a certain point, force is transmitted from independent keys 11 through plate 59 to the actuator 36 located under combination key 22. An array of plates 59 may be molded integrally with wedges 57 of a single high durometer elastomer or plastic, joined at the wedges at living hinges, for example, and then over-molded with the surrounding low durometer material, or configured as separate pieces as shown.

Figure 12:
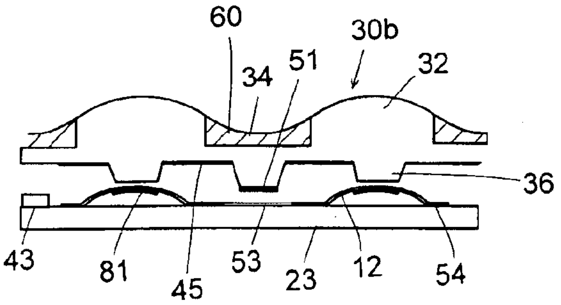

FIG. 12 shows a keymat 30*b* in which inserts 60 of a relatively high durometer material, such as a nylon plastic, are exposed in combination key regions 22. The relatively high durometer material serves as a force bridge similar to plate 59 of the keymat of FIG. 11. Low-force switch element 46 may be done with a carbon pill 51 that contacts PCB 23 through a hole 53.

Figure 13:
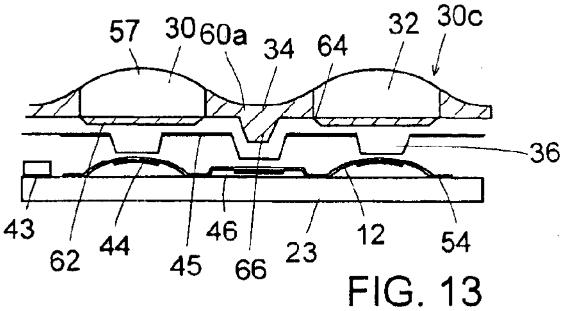

In FIG. 13 keymat 30*c* has inserts 60*a* connected to each other via links 62. While links 62 may be rigidly attached, they are illustrated here with thinned sections 64, providing a "living hinge" to enhance the motility of independent keys 11, while still providing an improved force transmission means to the switches disposed beneath combination keys 22. Inserts 60*a* have depending nubs 66. The thickness of nub 66 is selected to provide a desired amount of deformation of the elastomeric material of keymat 30*b* during actuation of a combination key 22.

Figure 14:
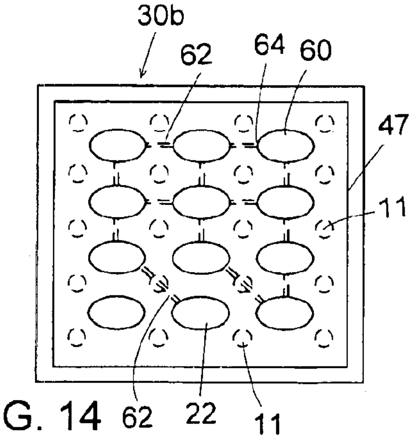
FIG. 14 is a top view of the keypad structure shown in FIG. 13.

FIG. 14 is a top view of the keypad structure shown in FIG. 13, in which independent keys 11 are represented by dashed circles. Combination keys 22 are identified by graphic characters printed on inserts 60. While oval is a preferred shape, other shapes, such as circles, may also be employed. Links 62 may be rectilinear as shown in the top half of this illustration, or diagonally oriented as shown in the shown in the lower half. Diagonal links are considered to provide greater force transmission to the switches of combination keys 22. Links 62 and inserts 60 may float within keymat 30*b* (i.e. only contact a relatively lower durometer material as opposed to a rigid housing of the device). Such floating can increase structural integrity, avoid impeding edge effects, and increase flexibility of the manufacturing process. To further reduce edge effects, edge treatment of flexure 47 (described in FIG. 42) may be employed.

Figure 15:
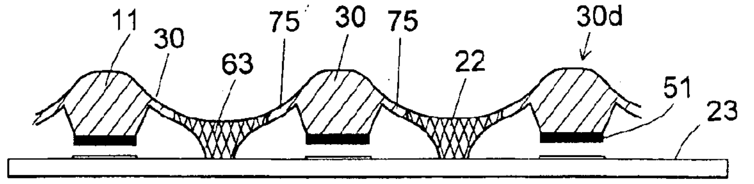
FIG. 15 shows a keymat with in-molded tactile feedback.

Referring now to FIG. 15, IACK keymat 30*d* is integrally molded in a "two-shot" process, with independent keys 11 molded in corresponding holes of a relatively rigid plastic matrix 63 that forms combination key regions 22. The switch function in this embodiment is provided by a carbon pill 51 disposed below each independent key 11, which is molded from a relatively low durometer elastomer, preferably of a durometer of about 45–55 shore A. As shown here, tactile feedback is provided by integrally molded, circular flanges 75 connecting the independent keys 11 to plastic matrix 63. Flanges 75, and even the extent of independent key regions 11, may be reinforced with narrow ribs of plastic of matrix 63, for enhanced snap force. This eliminates the need for an independent tactile structure, thereby saving material and assembly costs. Also, while not drawn to demonstrate a minimal height, the overall thickness may be reduced by virtue of the elimination of snap domes. As drawn here the independent keys 11 are approximately round in top view, with matrix 63 forming the balance of the keymat 30*d*.

Figure 16:
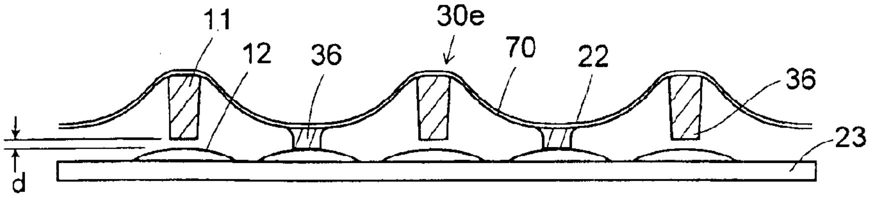
FIG. 16 shows a keymat with a thermoformed upper surface.

FIGS. 16–18 illustrate the operation of an IACK keymat 30*e* having a thin sheet 70 formed into the undulating surface contour of the exposed key regions, including elements for independent keys 11 and combination keys 22. The sheet 70 may be made of relatively hard and stiff material, such as polycarbonate or polyester, and formed with a process such as thermoforming. A sheet thickness of 0.002 to 0.005 inch is preferred, for example. Below each independent key region 11 is an actuator 36 of another material, formed in place such as by injection molding. Actuators 36 are disposed directly above respective, high-feedback n, such as metal or polyester domes. Likewise, there is an actuator 36 and high-feedback snap dome 12 below each combination key region 22.

As shown, there is a difference in the spacing between the lower surfaces of actuators 36 and their associated snap domes 12. The area of contact between sheet 70 and the actuators 36 of the independent keys 11 is limited to the portion of the independent key 11 that will not deform during use, predominantly the flat area at the top that is contacted by a finger 55 during activation of the independent key 11. The object is to transmit force to the tactile feedback element 12 while minimizing the rigidity of the sloped sides of the independent keys 11. The structure or structures that transmit force between sheet 70 and tactile feedback elements (snap domes) 12 need not be attached to sheet 70. At rest (FIG. 16), the actuators 36 located below independent key regions 11 are separated from their associated tactile elements by a distance "d" at least slightly greater than the stroke length of the tactile elements. In this illustrated embodiment, the heights and stroke lengths of all snap domes 12 are the same. This structure advantageously provides a single, well-defined tactile feedback when either a combination key 22 or an independent key 11 is pressed.

As shown, independent key actuators 36 underlie only the uppermost plateau regions of the independent key regions 11, across which the majority of finger actuation force is applied. This leaves the slanted sides of the raised independent key regions 11 free to bend during key actuation, as not constrained by actuators 36. This can be contrasted with the actuator structure shown in FIGS. 19–21, for example.

As a user's finger 55 presses to input the character printed on combination key 22 (FIG. 17), some deformation occurs within sheet 70, but the primarily result is downward deflection of the adjacent independent key regions 11 as the intended combination key region 22 deflects downward. Notably, however, the snap dome 12 directly below the combination key region 22 is tripped at a lower deflection distance than those of the adjacent independent key regions 11, as shown in FIG. 17. This provides a single and highly-defined tactile feedback (such as from a metal or poly dome) in response to actuating a combination key 22.

Conversely, as a user's finger 55 presses to actuate an independent key region 11 (FIG. 18), the snap dome 12 directly below that independent key is tripped before any of the surrounding tactile elements is tripped. As long as the force required to deflect sheet 70 about the actuated independent key region 11 is less than the combined trip force of the snap domes 12 located below the adjacent combination key regions 22, the selected independent key 11 will continue to advance to trip only its associated snap dome 12.

FIGS. 19–21 illustrate the same operational states as FIGS. 16–18, respectively, but with a keymat **30*f* having tapered, rigidity-enhancing ribs 72 extending radially from the base the actuators 36 of the combination keys 22 to each of the surrounding actuators 36 of independent keys 11. As shown, ribs 72 are thicker, to have greater cross-sectional moments of inertia to resist bending out of the plane of the sheet, nearest the combination key actuators 36, and taper in thickness for progressively reduced bending resistance toward the independent key regions 11**.

During combination key actuation (FIG. 20), ribs 72 act as force conduits, transmitting actuation force along sheet 70 to the appropriate combination key actuator 36. Ribs 72 also provide greater control over the rigidity of sheet 70, for transmitting torque from a single actuated independent key region 11 to tilt the force concentrators of the adjacent combination key regions 22, as shown in FIG. 21. The corresponding rotation of the combination key region causes some upward motion of the adjacent independent keys 11, as shown, with the snap domes 12 of the combination key regions acting as fulcrums but not tripping. In another embodiment, not shown, the distal ends of the combination key force concentrators are very narrow, to allow relatively easy tilting of the combination key actuators with respect to the associated snap domes 12 during independent key actuation. Coating the underside of the combination key actuators with a low friction material such as polyethylene, or forming the actuators 36 from such a material, can also help to avoid unintentional actuations. Thus, ribs 72 enable a selective increase in the rigidity of sheet 70, for tuning deflection regions somewhat independent from the geometry of exposed keypad sheet 70.

Additionally, for some applications the snap domes 12 below the combination key regions 22 are physically different from those of the independent key regions 11, to help assure only one snap dome actuation for each intended keystroke. For example, snap domes of different stroke lengths, trip forces, or shapes may be configured to advantage in combination with selected geometries, durometers and other physical properties of sheet 70 and actuators 36. One such example is the trip force of the snap domes 12 located below the independent keys 11 (e.g., about 250–300 grams) being higher than the trip force of the snap domes 12 located below the combination keys 22 (e.g., about 100–200 grams).

In FIG. 22, lighting is provided to keymat 30 by transmitting light 69 through the sheet 70, which is being used as a light pipe, allowing light 69 to flow to a maximal number of graphic characters while also acting as a diffuser there between, minimizing "hot spots," relatively intense concentrations of light. As shown here, the material of sheet 70 is predominantly transparent, with an ink 71 disposed on the outer surface providing color to keymat 30. The ink 71 is selectively omitted from the surface, creating voids 68 in the shape of characters or other symbols through which light is emitted, thereby defining the characters in part with light. If voids 68 are created by an etching process, such as by laser, the depth of the etch may extend into the material of sheet 70, thereby creating a character-shaped depression in the keymat 30 to better illuminate the graphics. In this manner, the embodiments provide the graphics with "side" lighting in addition to the more traditional "back" lighting. Employing translucent ink 71 allows the surface of the product to glow. A clear, hard coating may be sprayed over ink 71 for durability. FIG. 23 shows two sheets 70 laminated together, in which the outer sheet protects the ink 71 from scratching, and the inner sheet 70 provides a transmission path for light 69.

Figure 24:
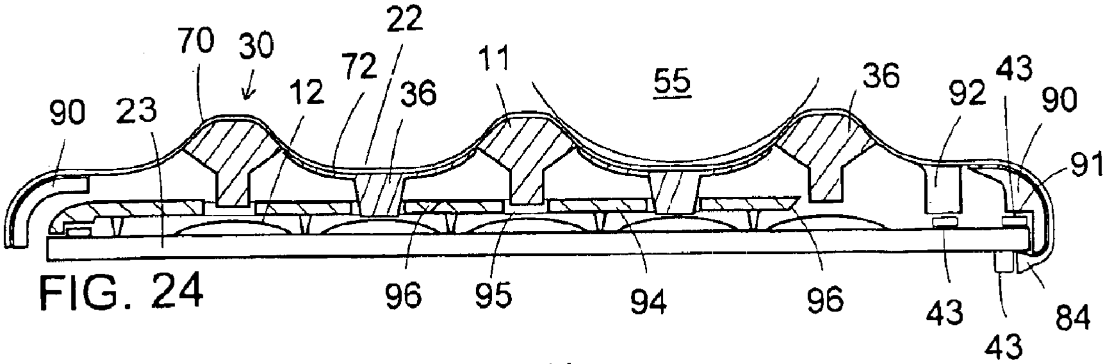
FIG. 24 shows light introduced to a thin plastic keymat in four ways.

FIG. 24 shows a keymat 30 with a variety of embodiments to introduce light 69 into sheet 70. In one embodiment, housing 90 is made of a transparent rigid material suitable for light piping (such as polycarbonate) and includes inlet feature 91 predominantly orthogonal to the light emitted from LED 43 such that visible light is collected 69 into sheet 70. Another embodiment includes guide 92, permanently attached to sheet 70 and disposed to extend between an optically transmissive, thin plastic sheet 70 and a light source such as an LED 43. Guide 92 may be integrally molded with actuators 36. The Fig. also shows a light funnel 84 disposed on at least one edge of sheet 70. Funnel 84 gradually narrows (as a function of the index of refraction of the material to provide a high degree of internal reflection) such that a maximal amount of light 69 from a source like LED 43 can enter. Funnel 84 can be integrally extruded into sheet 70 as it is manufactured. Sheet 70 may subsequently be stamped to remove portions of the funnel other than adjacent LEDs.

The "side-lighting" of these embodiments also provides a glow to housing 90, an effect that is believed to enhance the market appeal of devices incorporating this feature. FIG. 24 also shows pipe 94 used to supply backlight to the center of an IACK keypad, which, in addition to providing backlight, may also serve as a source of side-lighting by transmitting light into sheet 70. Pipe 94 is perforated with holes 95 through which actuators 36 pass and which includes reflectors 96 to divert light upwards to the underside of keymat 30. LED 43 is mounted on at least one periphery of the switch matrix and injects light 69 into pipe 94 with a reflector 96. Individual, elastomeric, flexible light pipes (not shown) may connect LEDs 43 to central areas of keymat 30.

Figure 25:
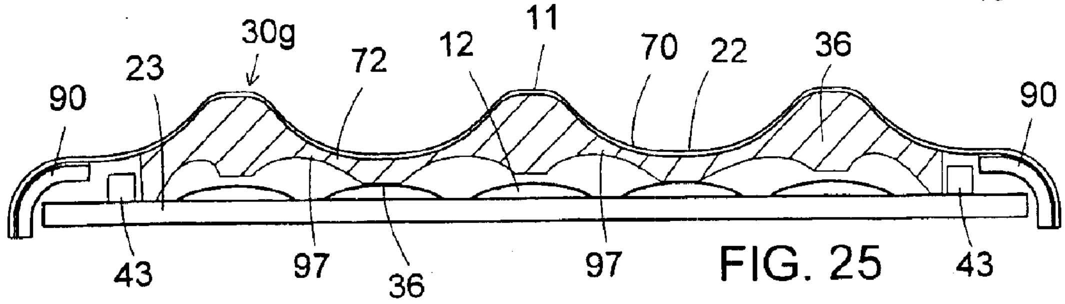
FIG. 25 shows a plastic keymat backfilled with a light transmissive elastomer.

FIG. 25 shows keymat **30*g* with actuators 36 formed from an optically transmissive elastomeric material, such as clear silicone, in which a plurality of concentrators 36 are connected by an integrally molded, thin web 97. The respective heights of each actuator 36 are similar to other disclosed embodiments, except for variations necessary to accommodate the selected durometer and the material compression that will occur above each snap dome 12**, as a function of the tactile force each provides.

Figure 26:
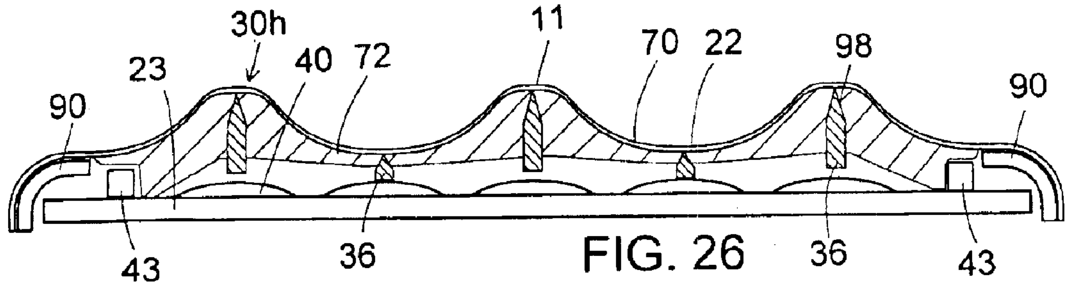
FIG. 26 shows narrow actuation posts molded in to a back-filled elastomer.

FIG. 26 shows keymat 30*h*, a variation of the embodiment of FIG. 25, in which actuators 36 are formed of a rigid, optically transmissive material, and are cone-shaped for improved light transmission and material compression. These may be formed with a two shot in-mold process, in which the elastomeric material forming web 97 is formed first and a second shot forms a higher durometer material of the actuators 36. Alternatively, concentrators 36 may be insert-molded in a softer elastomer. The upper surfaces of concentrators 36 may be shaped to form letters or other symbols identifying key regions.

Figure 27:
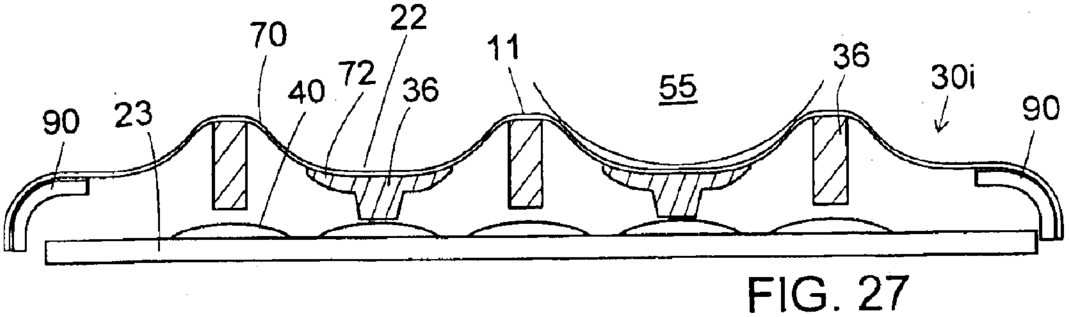
FIG. 27 narrow actuation posts and adhered to a thin plastic membrane.

FIG. 27 shows a keymat 30*i*, a variation of the embodiments shown in FIGS. 16–21, in which the high differential between the combination keys 22 and independent keys 11 is minimized, so as to maximize the contact of finger 55 with the base of combination key 22, to increase force transmission directly between the finger 55 and the associated actuator 36.

Figure 28:
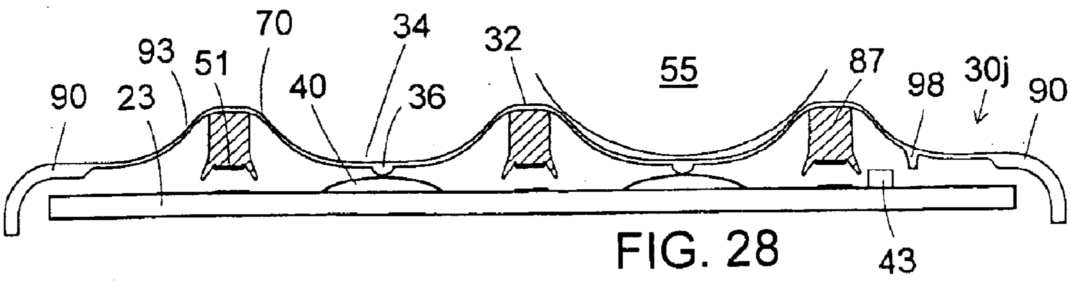
FIG. 28 shows a keymat molded into the case and elastomeric tactile feedback elements molded into actuation post.

FIG. 28 shows keymat 30*j* in which sheet 70 is made of engineering grade plastic, such as polycarbonate, and integrally molded with the housing 90. This reduces assembly cost and part count while also providing hard plastic IACK keymat with a seamless barrier to contaminants. Actuators 36 are also integrally molded below the combination key regions 22. The combination key regions have a relatively high tactile feedback from metal or poly dome tactile feedback domes 12. However, molded tactile feedback elements 87 below the independent key regions 11 provide a relatively low tactile feedback, as their associated circumferential flanges 89 collapse at the bottom of an activation stroke. This provides distinctly different feedback between the combination keys and independent keys, such that the combination and independent key regions each mimic the familiar tactile response of different devices, such as a phone and a desktop keyboard (respectively) in this example. Carbon pills 51 are disposed at the base of molded tactile feedback elements 87 where they activate the associated switch as they contact PCB 23. The tactile feedback provided by flanges 89 may be provided by other means, such as deformation of sheet 70. That is to say that sheet 70, such as the sloped portion 93 around the plateau centers of each independent key region 11, may be molded to provide tactile feedback. Travel limiters 98 may also be integrally molded within sheet 70 to protect LED's 43.

Figure 29:
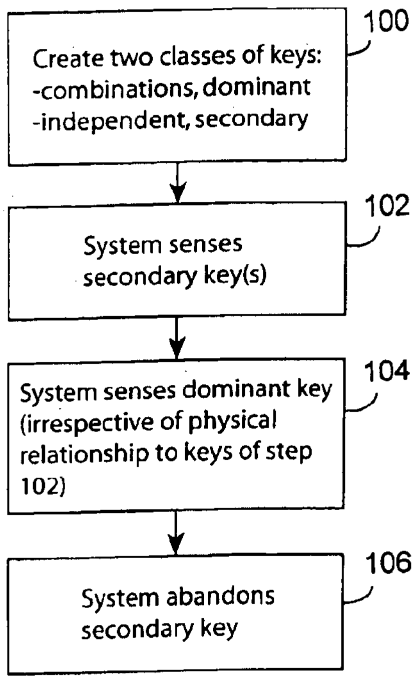
FIGS. 29 and 30 show operational algorithms for a keypad.
Figure 32:
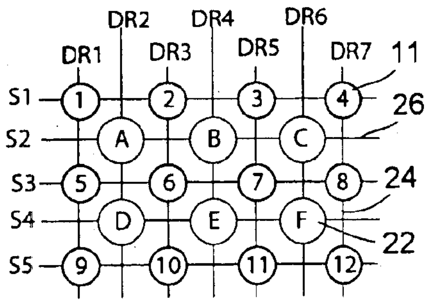

FIG. 29 shows a decoding method (incompatible with the structures of prior art IACK keypads) that simplifies the software and reduces the processing steps necessary to operate an IACK keypad. In step 100 two classes of keys are created in software. These may be as simple as lists of the two types of keys (11 and 22), or also a list of one type of key and the remaining keys are (by default) of the second type. Independent keys 11 are assigned to a secondary class and combination keys 22 are assigned to a dominant class. Notably, the relative locations of specific independent 11 and combination keys 22 are not part of the decoding algorithm, rather absolute location and class are used to define the intended output. Conversely, with some earlier IACK keypads, knowing the relative position of each key was fundamental to operation. In step 102, the system senses the user pressing a secondary key, such as independent key 11. The system may post this key, or wait a designated delay period. In step 104 the user presses (and the system senses) another key actuation before the secondary key is released. The software does not need to analyze which diagonals are involved and perform a correlation between the selected diagonals and the combination key between them, as any key on the dominant class will supercede any key of the secondary class. Referring briefly to FIG. 32, activation of the 'A' key would require activation of elevated key regions 1 and 6, or 2 and 5. In this algorithm any of keys 1 through 12, in combination with 'A' will yield an 'A' output, as will key 'A' by itself. The locations of the independent keys are immaterial. In step 106 the system abandons the secondary key for the primary key.

Figure 30:
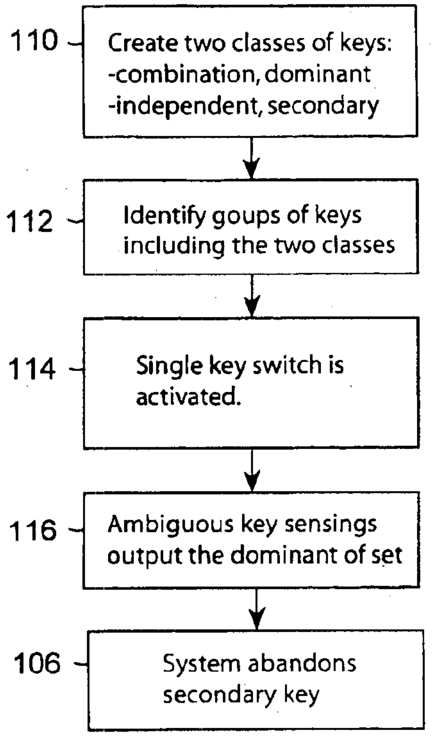
Figure 31:
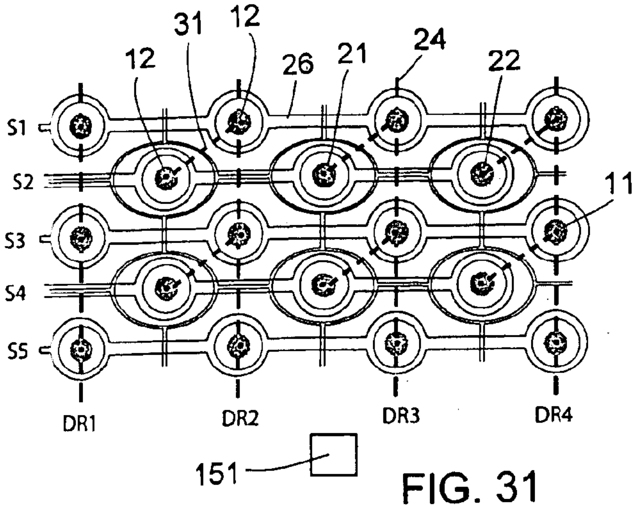
FIGS. 31 and 32 show circuit board layouts useful with the algorithms of FIGS. 29 and 30.

FIG. 30 shows another decoding method that simplifies the software and reduces the processing steps necessary to operate an IACK keypad. This method is suitable for use with printed circuit board layouts as shown in FIGS. 31 and 32. In step 110, two classes of keys are identified, analogous to step 100 in FIG. 29. In step 112, additional lists are created in which each dominant key is associated with the adjacent secondary keys. Referencing FIG. 32, 'A' is associated with 1, 2, 5 and 6; 'B' with 2, 3, 6 and 7; 'C' with 3, 4, 7 and 8; 'D' with 5, 6, 9 and 10'; 'E' with 6, 7, 10 and 11; and 'F' with 7, 8, 11 and 12. Note that the same result may be achieved by creating a single set of lists in which a predefined element is of a particular class, such as: 'A,1,2, 5,6'; 'B,2,3,6,7'; 'C, 3, 4, 7, 8'; 'D, 5, 6, 9, 10'; 'E, 6,7,10, 11'; and 'F, 7, 8, 11, 12' in which a particular character of each list (in this case the first character) is the dominant key. The other characters, identifying physically adjacent keys, may be listed in a random order, as location with respect to the dominant (combination 22) key is immaterial. In step 114 a single key is pressed and the system outputs the character associated with a single actuated switch (combination or independent). In step 116 a switch associated with a combination key and as few as one associated independent key is pressed. In this step the system references the classifications and prioritizations made in steps 110 and 112, and provides as output the character listed as dominant (i.e. the output associated with combination key 22). As with the method of FIG. 29, output is not based exclusively on combinations of opposite-adjacent keys, as with some prior IACK keypads. This method in combination with the PCB layout of FIG. 31 also allows successful differentiation between independent, combination and ambiguous key groupings in a single cycle by driving two adjacent drive lines simultaneously. Specifically, in some prior art IACK keypads it was possible to drive adjacent lines simultaneously and thereby determine a combination key in a single step, an approach that can yield ambiguous results if two adjacent horizontal or two adjacent vertical keys are pressed. This ambiguity required a second cycle to determine the true state of the switch matrix. This problem is now solved in that adjacent drive lines may be pulsed simultaneously to provide non-ambiguous information of the matrix and accurately determining both independent and valid combination key combinations in a single cycle. This method also works for keypads in which keys are independently addressable, such as keypads in which each switch as an associated diode. In step 106, the system may abandon an earlier selected secondary key in favor of the dominant key.

Figure 39:
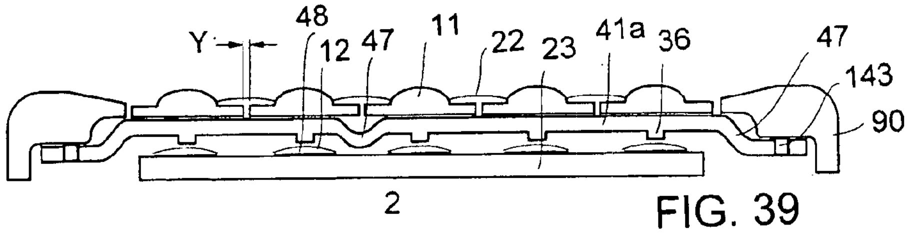
FIG. 39 shows a keypad with a keymat molded with a flexure points.

FIG. 31 shows a hardware configuration for implementing the methods of FIGS. 29 and 39. Sense lines 26 have been added to measure output from combination keys 22. The input is provided to combination keys 22 by bridge 31 that taps a signal from the drive line 24. Sense lines 26 lead to processor 151. An electrical word on the drive lines 24 can be read on the sense lines 26 to identify any combination key 22 or independent key 11 switch. This information is used preferably with the methods of FIGS. 29 and 30.

FIG. 32 shows another PCB design useful for implementing the methods of FIGS. 29 and 30. In this case, switches of combination key 22 are fed directly by drive lines 24, labeled as DR2, DR4, and DR6.

Figure 33:
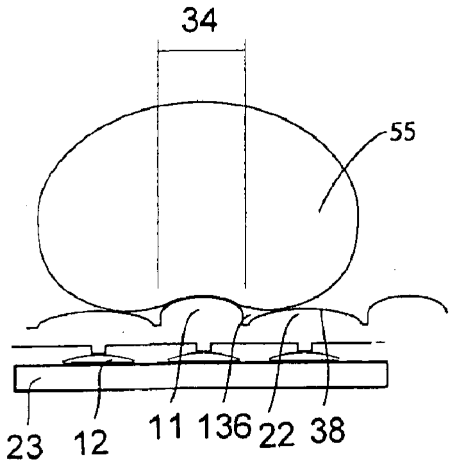
FIG. 33 shows a finger pressing on an elevated key region.

Referring next to FIG. 33, the force applied by the finger 55 is concentrated at its center region 34, at the peak of the curvature and centered under the bone. The force is transmitted through center region 34 and the outer portions of finger 55 conform around elevated key region 11. Local depression 136 is formed between the independent key 11 on one side and a convex surface 38 of combination key region 22. Depressed region 136 provides a tactile distinction between the independent keys 11 and combination keys 22.

Figure 34:
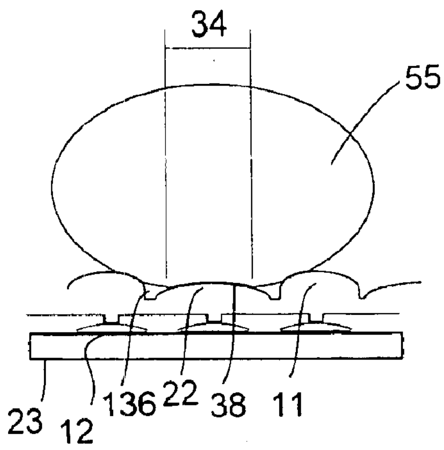
FIG. 34 shows a finger pressing on a convex, non-elevated key region.

FIG. 34 shows a finger 55 pressing against combination key 22. Combination key 22 is crowned, with a convex shape 38, presenting an elevated surface to meet the center region 34, but not elevated as compared to the independent key regions 11, which are at least effectively elevated over the combination key regions 22 in that a fleshy finger 55 will advance farther into the keypad to activate a combination key region 22 as placed in FIG. 34, than the same finger would to activate an adjacent independent key region 11 when placed as in FIG. 33. Directly distal to center region 34 of combination key 22 is a depressed region 136 that dissociates force from the finger, with the result of further concentrating the force in the center region 34 and to help avoid distributing force over a greater area and onto the adjacent independent keys 11. This increases the force transmission through convex shape 38, and thereby allows the finger 55 to actuate combination key 22 (which includes a single and independently operable switch below to provide a clearly defined tactile response) while reducing the chance of actuating adjacent independent keys 11. However, the inadvertent actuation of one of more of the adjacent independent keys 11, such as by inaccurate finger placement or a large finger, may be accommodated by the electronics of FIG. 31 or 32 and the algorithm of FIGS. 29 or 30.

Figure 35:
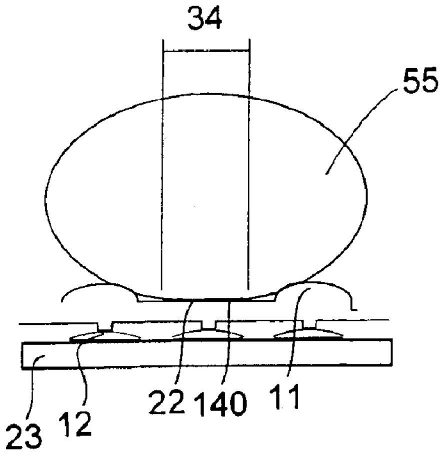
FIG. 35 shows a finger pressing on a flat, non-elevated key region.

FIG. 35 shows a finger pressing against a combination key region 22 with an effectively flat shape 140. Again, a single and independently operable switch below the combination key region provides a clearly defined tactile response.

Figure 36:
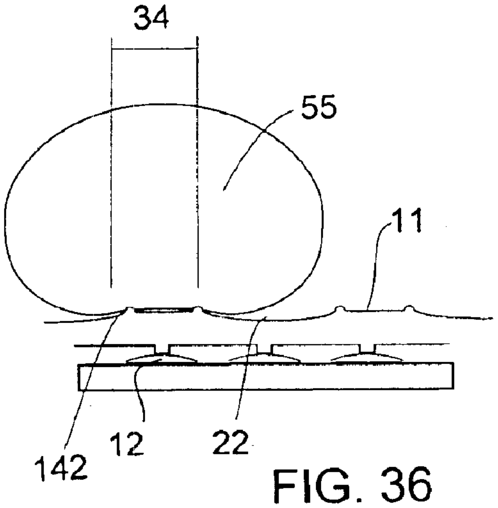
FIG. 36 shows a finger pressing on an elevated key region with a raised edge.

FIG. 36 shows a finger pressing against an elevated key region 11 of a keypad in which the keypad surface is basically planar, with the independent keys 11 identified by a tactile element 142 such as a ring or edge definition and combination key 22 is concave.

Figure 37:
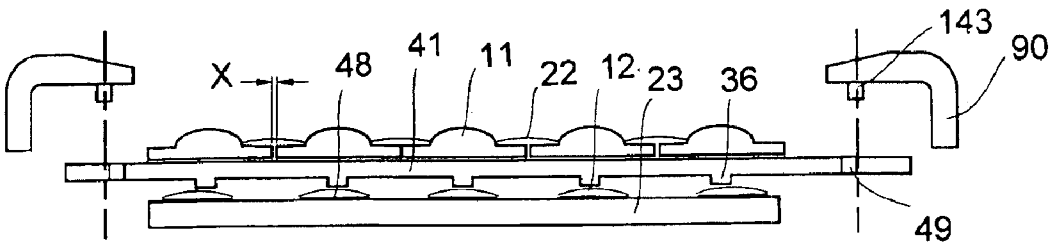
FIG. 37 shows an elastic keymat disassembled from its housing.
Figure 38:
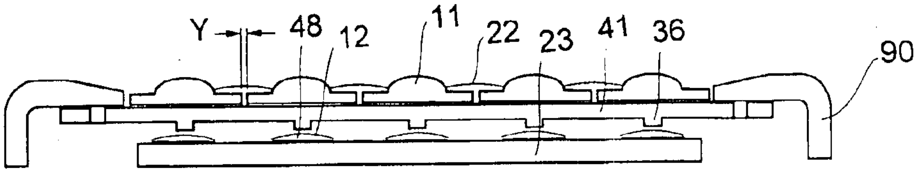
FIG. 38 shows the keypad of FIG. 37 as assembled.
Figure 40:
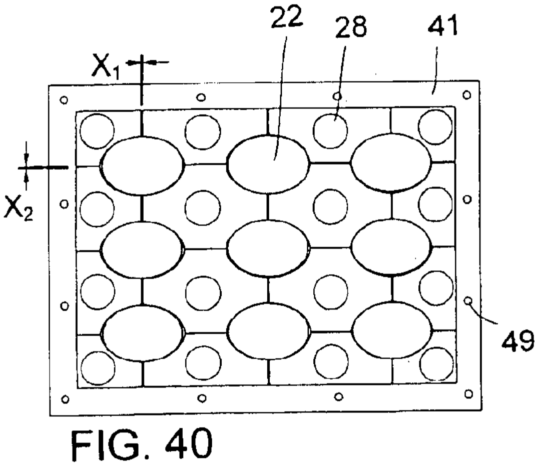
FIG. 40 is a top view of the elastomeric sheet of the keypad of FIG. 37.

FIG. 37 shows a keypad disassembled from the housing 90 of the associated electronic device. Separate combination keys 22 and independent keys 11 are adhered to an elastomeric sheet 41. In order to increase the reliability of consistent mechanical contact between the actuators 36 and snap domes 12, the elastomeric sheet 41 is manufactured undersized with respect to the restraint elements 143, so that elastomeric sheet 41 is placed in tension when assembled, as shown in FIG. 38. In other words, the elastomeric sheet is stretched (i.e., placed in tension) to fit onto the restraint elements. That is to say that the distance across the housing between the restraint elements 143 is greater than the distance between the corresponding location features 49 in the sheet 41. The keys in the center (such as the center one here) are located as they will be after assembly, however in one embodiment; keys increasingly near the periphery are adhered to the sheet 41 at an increasingly proximal location to their post-manufactured position, so that upon assembly (and stretching of the sheet 41), the keys are correctly positioned. Dimension "x" shows the gap between adjacent keys prior to assembly. Likewise, in one embodiment, the position of either the actuators 36, or the metal domes 12 and the dome's switches 48 are displaced (misaligned) relative to the non-assembled sheet 41, such that the actuator 36, metal dome 12 and dome switches 48 printed on PCB 23 align only after assembly (as shown in FIG. 38). FIG. 40 shows a plan view of the elastomeric sheet 41, in which the keys are distanced from each other in one direction by a distance x1 and in a perpendicular distance by a distance x2.

Figure 41:
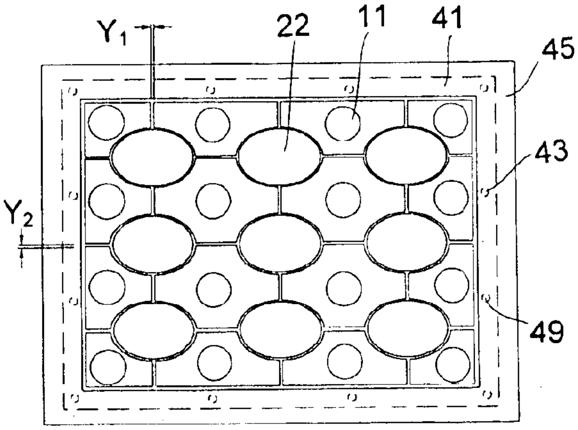
FIG. 41 is a top view of the keypad of FIG. 38.

Referring to FIG. 38, when the keypad is assembled the gap between adjacent keys is denoted as "y". At the edge of a typical keypad, (the keys most effected) the difference between "x" and "y" is over 20 percent, typically on the order of 20 to 80 percent. After assembly the keys and actuators 36 align with the switches 48. The keypad is designed undersized to the opening in the housing 90. FIG. 41 shows a plan view of the elastomeric sheet 41 assembled to the keypad, in which the keys are distanced from each other in one direction by a distance y1 and in a perpendicular distance by a distance y2.

Alternatively, the key structures may be secured to the elastomeric sheet with the sheet in its stretched state, to control inter-key gap distances.

The elastomeric sheet 41*a* of the keypad of FIG. 39 is molded to have a pleat 47 or other resilient formation that acts as a means to maintain tension in the elastomeric sheet over a wider range of temperatures for a given tension. The distance between the restraint elements 143 is larger than the distance between the corresponding location features 49 in the sheet 41, such that in the assembled keypad, flexure 47 is somewhat distended from its molded state.

Figure 42:
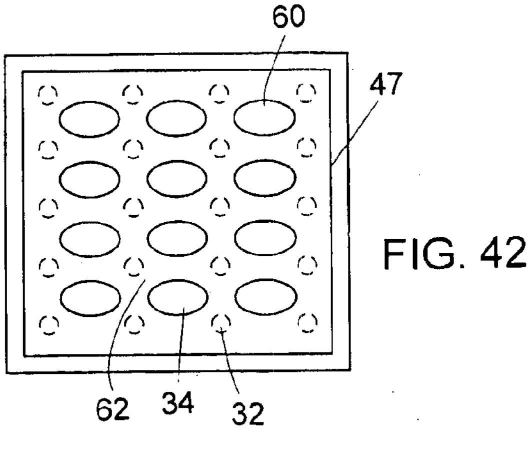
FIG. 42 shows a rigid keymat with a flexure at its periphery.

FIG. 42 shows an IACK keymat with a relatively rigid (e.g., molded plastic) center section spanning all of the key regions, and a resiliently distendable section 47 at the edge. The peripheral section 47 may be of the same material as the center section but of lesser thickness, or may be of a material of lower durometer than the center section. The keymat thus deflects during operation, (at least to a degree) as a single large key. In other words, low force deflection is spread over a large area of the keypad instead of being concentrated in a local area of finger contact. Thus, for any given keystroke, a portion of key deflection occurs locally and another portion is extends "globally," over the entire center region 62 of the keymat. This improves the reliability of the actuation of combination keys 34 by reducing the relative motion that occurs between the independent keys 32 for a given keystroke. This construction has benefit to highly flexible key mats, but has enhanced benefit to keypads of reduced flexibility, as shown here.

FIG. 43 shows an IACK keypad 10 including a plastic (predominantly rigid) web, approximately 0.5 to 1.0 millimeter thick, forming a continuous surface over the area of the keypad, with holes through which the combination keys 22 are exposed. The dashed area designates the extent of the web 40. Because the web 40 is a plastic material it can be made of the same material as the housing 90 of the product itself, and furthermore, can be made continuous with the housing 90 of the product. This can provide a significant advantage in design flexibility, aesthetics (by virtue of being the same material the problems of color matching dissimilar material, potentially manufactured in different facilities, is eliminated), durability, and cost. No tilings are used, eliminating edges which could catch on a fibrous material, such as a sweater. Independent keys 11 are defined by local elevations of the material of the web 40, and are activated by flexure of the hard plastic. The combination keys 22 are discrete plastic (predominantly rigid) keys located in the holes in the web 40. The result is a predominantly rigid keypad with sufficient flexure to allow tactile feedback to be felt by the user. Additional troughs may be provided in the backside of the web to increase its flexibility, preferably oriented along a common direction allows for the flow of fluid plastic during the manufacturing process. The transition region between the housing and keymat may be thinned, or formed of a lower durometer material, such as polyurethane, to allow for additional compliance at the edge of the keymat. The relatively non-motile portions (in this case the independent keys 11 and web 40) can be referred to jointly as the face plate of the keypad.

Referring also to FIG. 44, combination keys 22 include a slight (convex) protrusion, or small hill, although notably shorter than the height of the independent keys 11. The independent keys 11 are taller than the combination keys 22 by approximately 0.25 to 0.75 millimeter. The overall heights of the keys, as measured from the lowest surface of the actuator 36 to the highest surface above it, is such that the bulk of the force profile (center region 34) provided by the curvature of a user's finger (higher in the center and progressively less toward the edges) fits within the region of the combination key 22, including the state after the snap dome 12 has been actuated. In another embodiment, independent keys 11 and combination keys 22 are nearly the same height. The discontinuous keys are held to the keypad 10 by an elastomeric sheet 41. Although web 40 is rigid, the overall structure can displace relative to PCB 23 and the web 40 can displace relative to the combination keys 22. This flexure/displacement allows operation of IACK keypads with a rigid plastic face.

FIG. 45 shows an example in which the combination keys 22 are integrally molded with the web 40, and independent keys 11 are discontinuous. The relatively non-motile portions (in this case the combination keys 22 and web 40) can be referred to jointly as the face plate of the keypad 10. While pressing combination keys 22, the face plate deflects.

Referring also to FIG. 46, the extent of the oval of the combination key 22, along its major axis, is labeled as "W". In this embodiment, the contiguous extra width of the web 40 (beyond W) provides an effective increase in the size of the combination key 22 relative to the embodiment of FIGS. 43 and 44, thereby assisting the designer to keep the bulk of the force profile of the users finger away from actuating the hill keys. Note also that accidental actuation of hill keys 11 is acceptable, as the only detriment is additional tactile feedback. The extra signal provided to the system does not cause a problem. Although web 40 is rigid, the overall structure can displace relative to PCB 23 and the web 40 can displace relative to the independent keys 11. This flexure/displacement allows operation of IACK keypads with a rigid plastic face plate. The discontinuous keys are held to the keypad 10 by an elastomeric sheet 41. It is also possible to implement the embodiments of FIGS. 43 and 45 in the same product by providing independent motility in both independent keys 11 and combination key 22 as long as web 40 is allowed low-force flexure at least as long as the stroke of key actuation.

Referring next to FIGS. 47 and 48, a metal snap dome 12 has an elevated central region 212 forming a downwardly facing cavity 13 defined at its edge by a geometric discontinuity 214. The discontinuity 214 is disposed above at least two switch contacts 21 that are normally electrically isolated from each other, disposed on printed circuit board 23. Metal snap dome 12 includes edge 118, which rests upon another electrically distinct switch element, signal reference 224. Actuator 36 is located to apply force to, and thereby displace, elevated central region 212. Note that forces applied by the actuator 36 are not transmitted to the PCB 23 downward (below the center of the actuator 20), but by material located off-center, in this case the underside of discontinuity 214 located radially outward from the center 17 of the actuator. The result is that the bulk of the force applied by the actuator 36 is not applied in a point, but distributed over a line, in this case a line curved to form a circular contact zone 230. Contact zone 230 is approximately ⅓ the nominal diameter of the metal dome 10, creating "third" points, or contact points (in the contact zone 230) approximately equidistance between edges 118 and each other. Therefore as one side of discontinuity 214 touches a first switch element 16 a torque will be placed upon that contact point, acting to force the other side of discontinuity 214 into contact with a second switch element 16. The objective is to reliably connect two or more separate electrical lines to a common signal reference 24. The discontinuity 214 may be in the form of a downward ring-like indentation, such that the elevated central region 212 is elevated relative to the lower edge of the discontinuity 214, but not distinctly the rest of the snap dome 12.

As shown in FIG. 48, along the contact zone 230 the dome contacts three switch elements 16. Signal reference 24 acts as the fourth element. Vias 32 connect switch elements 16 to traces on lower layers of the PCB. Each switch element 16 extends over an angle α, in this example about 20 degrees, equating to approximately ⅙ of the circumference of contact zone 230 comprised of switch elements 16. Reducing the value of α furthers the objectives of the theory of operation explained in FIG. 47 by making contact with one or two switch elements 16 an unstable configuration. Therefore a force applied to the center axis 17 will apply an increased torque to assist with establishing contact between the metal dome 10 and each switch element 16, even if two contacts are already established. The instability provided by contacting the snap dome 12, the torque provided by contacting near the trip point and the narrowness of the traces, thereby increasing local pressure, are among the envisioned potential advantages of this approach. Note that three switch elements 16 are shown, two (and to a lesser extent four) switch elements 16 may also benefit from this design. Discontinuity 214 may be formed as a ring of spaced ridges, as shown in FIG. 49, with ridge lengths and gaps selected to facilitate reliable contact with each switch element 16.

Some further features of keypad constructions can be found in the following pending U.S. patent applications: Ser. No. 60/382,906, filed May 23, 2002; Ser. Nos. 60/419,843, filed Oct. 21, 2002; 60/431,796, filed Dec. 9, 2002; and 60/444,227, filed Feb. 3, 2003, the entire disclosures of each of which are incorporated herein by reference.

A number of embodiments of the invention have been described. Nevertheless, it will be understood that various modifications may be made without departing from the spirit and scope of the invention. Accordingly, other embodiments are within the scope of the following claims.

What is claimed is:

1. A keypad comprising a matrix of key regions including an array of elevated key regions each providing a corresponding character output when actuated; and key regions interspersed between the elevated key regions and providing character output based at least in part on an operation algorithm that includes activation of at least one adjacent elevated key region; wherein the keypad includes corresponding, independently actuatable key switches disposed below the interspersed key regions, the operation algorithm also including actuation of the associated switches below the interspersed key regions.

2. The keypad of claim 1 wherein adjacent elevated key regions have an on-center distance of less than about half the width of the adult human finger.

3. The keypad of claim 1 comprising corresponding tactile feedback elements underlying each elevated key region and each interspersed key region.

4. The keypad of claim 3 wherein the operation algorithm, in response to sensing a combined switch actuation including any switch underlying an elevated key region and a switch underlying an interspersed key region, produces an output corresponding to the interspersed key region.

5. The keypad of claim 3 wherein the operation algorithm, in response to sensing a combined switch actuation including a switch underlying an interspersed key region and any switch underlying an elevated key region immediately adjacent that interspersed key region, produces an output corresponding to the interspersed key region.

6. The keypad of claim 1 wherein each switch disposed below an interspersed key region is directly connected to a switch disposed below another interspersed key region, and to a switch disposed below an elevated key region.

7. The keypad of claim 1 wherein the interspersed key regions have exposed surfaces that are convex.

8. The keypad of claim 1 wherein the interspersed key regions have exposed surfaces that are substantially flat.

9. The keypad of claim 1 wherein the elevated key regions each include an elevated ridge defining a top surface.

10. The keypad of claim 1 wherein each interspersed key region is immediately adjacent a plurality of the elevated key regions.

11. The keypad of claim 1 including a printed circuit board with traces electrically connecting each of at least some switches underlying elevated key regions with a switch underlying a corresponding one of the interspersed key regions.

12. The keypad of claim 1 including a printed circuit board with four electrical trace extensions extending to beneath each of the interspersed key regions, to form switch contacts.

13. The keypad of claim 12 wherein two of the trace extensions under each interspersed key region connect to a tactile dome, and the other two trace extensions connect to exposed traces that are momentarily placed into electrical contact when that interspersed key region is actuated.

14. The keypad of claim 1 wherein each switch disposed below an interspersed key region is actuated by electrical traces of a printed circuit board contacting a discontinuity in an inner surface of a metal snap dome.

15. The keypad of claim 14 wherein the traces contacted by the snap dome surface discontinuity form three discrete contacts spaced about a circular contact zone beneath the snap dome.

16. The keypad of claim 14 wherein the discontinuity is centrally located under the snap dome and is of a diameter about one third of an overall diameter of the snap dome.

17. The keypad of claim 1 wherein the switches disposed below the interspersed key regions each includes a tactile feedback element and a carbon ring.

18. The keypad of claim 17 wherein the tactile feedback elements are electrically passive.

19. The keypad of claim 17 wherein the switches disposed below the interspersed key regions are each connected to three signal traces, forming a single access to the switch from one side of the matrix, and two access points from another side of the matrix.

20. The keypad of claim 1 wherein either the elevated or interspersed key regions are respective areas of a molded plastic keymat that flexes during key actuation.

21. The keypad of claim 20 wherein key regions that are not respective areas of the molded plastic keymat are exposed through respective, spaced apart holes in the keymat.

22. The keypad of claim 1 wherein the key regions are upper surfaces of keys secured to a sheet held in a stretched condition above an array of key switches.

23. The keypad of claim 22 wherein the stretched sheet comprises a sheet of elastomeric resin.

24. The keypad of claim 23 wherein the elastomeric sheet is held in a stretched condition of at least 20 percent in at least one direction.

25. The keypad of claim 22 wherein the keymat comprises a plastic sheet molded to have a resiliently distendable region.

26. The keypad of claim 25 wherein the resiliently distendable region comprises a pleat extending out of a principal plane of the sheet.

27. A keypad comprising a keymat and a switch substrate underlying the keymat, the keymat having an exposed upper surface forming separate elevated key regions that, when pressed independent of adjacent key regions, produces an output associated with the pressed key region, the keymat also defining other key regions interspersed between adjacent elevated key regions and labeled to indicate other outputs associated with the interspersed key regions, wherein the keymat is rigidly held at its perimeter in a stretched condition across the switch substrate.

28. The keypad of claim 27 wherein the elevated key regions are upper surfaces of rigid keys secured to an elastomeric sheet.

29. The keypad of claim 28 wherein the elastomeric sheet is held in a stretched condition of at least 20 percent in a single direction.

30. The keypad of claim 27 wherein the keymat comprises a plastic sheet molded to have a resiliently distendable region.

31. The keypad of claim 30 wherein the resiliently distendable region comprises a pleat extending out of a principal plane of the sheet.

32. The keypad of claim 27 keymat is held stretched in each of two orthogonal directions.

33. The keypad of claim 27 wherein the keymat defines peripheral holes that, with the keymat stretched, receive pins of a rigid keypad housing.

34. An electrical key switch comprising a printed circuit board with at least two switch contacts that are normally electrically isolated from each other; and a metal snap dome disposed above the printed circuit board, the dome having an elevated central region forming a downwardly facing cavity defined at its edge by a ridge disposed above and spaced from the switch contacts, such that when the snap dome is actuated the ridge about the central region engages the printed circuit board in an annular contact zone across the switch contacts, making electrical contact between the snap dome and the switch contacts.

35. The key switch of claim 34 wherein the snap dome has an outer edge disposed against and in electrical contact with a reference trace on the printed circuit board.

36. The key switch of claim 34 wherein the annular contact zone is about one-third of a nominal diameter of the metal dome.

37. The key switch of claim 34 wherein the switch contacts are wedge-shaped.

38. The key switch of claim 37 wherein each switch contact extends across about 20 degrees of the circumference of the contact zone.

39. The key switch of claim 34 wherein the switch contacts are disposed approximately equidistant from each other about the contact zone.

40. The key switch of claim 34 wherein the ridge forms a continuous ring.

41. The key switch of claim 34 wherein the ridge comprises a ring of spaced ridge segments.

42. The key switch of claim 34 wherein the snap dome overlays three spaced apart switch contacts.

* * * * *